US007671979B2

(12) United States Patent
Smith et al.

(10) Patent No.: US 7,671,979 B2
(45) Date of Patent: *Mar. 2, 2010

(54) APPARATUS AND PROCESS FOR DETERMINATION OF DYNAMIC LENS FIELD CURVATURE

(75) Inventors: Adlai H. Smith, Escondido, CA (US); Robert O. Hunter, Jr., San Diego, CA (US)

(73) Assignee: Litel Instruments, San Diego, CA (US)

( * ) Notice: Subject to any disclaimer, the term of this patent is extended or adjusted under 35 U.S.C. 154(b) by 367 days.

This patent is subject to a terminal disclaimer.

(21) Appl. No.: 10/833,557

(22) Filed: Apr. 28, 2004

(65) Prior Publication Data

US 2005/0243309 A1    Nov. 3, 2005

(51) Int. Cl.
 *G01B 9/00* (2006.01)
(52) U.S. Cl. .................................................. 356/124
(58) Field of Classification Search ............... 356/124, 356/399–401
 See application file for complete search history.

(56) References Cited

U.S. PATENT DOCUMENTS

| | | | | |
|---|---|---|---|---|
| 4,861,148 | A | 8/1989 | Sato et al. | 350/505 |
| 5,285,236 | A | 2/1994 | Jain | 355/53 |
| 5,300,786 | A * | 4/1994 | Brunner et al. | 250/548 |
| 5,303,002 | A | 4/1994 | Yan | 355/53 |
| 5,402,224 | A | 3/1995 | Hirukawa et al. | |
| 5,757,507 | A | 5/1998 | Auschnitt et al. | 356/401 |
| 5,814,425 | A | 9/1998 | Kataoka et al. | |
| 5,828,455 | A | 10/1998 | Smith et al. | 356/354 |
| 5,936,738 | A | 8/1999 | Liebmann et al. | 356/401 |
| 5,978,085 | A | 11/1999 | Smith et al. | 356/354 |
| 6,982,786 | B2 * | 1/2006 | Shiode | 356/121 |
| 7,126,668 | B2 * | 10/2006 | Smith et al. | 355/55 |
| 7,295,291 | B2 * | 11/2007 | Smith et al. | 356/124 |
| 2002/0071112 | A1 * | 6/2002 | Smith et al. | 356/124 |
| 2003/0095247 | A1 | 5/2003 | Nakao | |
| 2003/0202174 | A1 | 10/2003 | Smith et al. | |

FOREIGN PATENT DOCUMENTS

DE    102 23 761 A1    6/2003
EP    0 595 196 A    5/1994

(Continued)

OTHER PUBLICATIONS

International Search Report for International Patent Application No. PCT/US2005/012499.

(Continued)

*Primary Examiner*—Tarifur R. Chowdhury
*Assistant Examiner*—Isiaka O Akanbi

(57) ABSTRACT

A technique for the determination of dynamic lens field curvature uniquely associated with a photolithographic scanner is described. A series of lithographic exposures is performed on a resist coated silicon wafer using a photolithographic scanner. The lithographic exposures produce an array of focusing fiducials that are displaced relative to each other in a unique way. The resulting measurements are fed into a computer algorithm that determines the dynamic lens field curvature (ZDLC) perpendicular to the scanning direction in an absolute sense. Furthermore, the effects of wafer flatness, wafer surface non-uniformity, and stage error are considered. The ZDLC information can be used to improve lithographic modeling, overlay modeling, and advanced process control techniques related to scanner stage dynamics.

17 Claims, 17 Drawing Sheets

FOREIGN PATENT DOCUMENTS

| EP | 1 063 569 A | 12/2000 |
|---|---|---|
| EP | 1 326 416 A | 7/2003 |
| JP | 2003-156832 | 5/2003 |

OTHER PUBLICATIONS

R. DeJule, "Mix-and-Match: A Necessary Choice", *Semiconductor International*, Feb. 2000, pp. 66-76.

R. DeJule, "A Look at Overlay Error", *Semiconductor International*, Feb. 2000, p. 52.

D. Cote et al., "Micrascan™ III Performance of a Third Generation, Catadioptric Step and Scan Lithographic Tool", *SPIE* vol. 3051, pp. 806-816.

J. Mulkens et al., "ArF Step and Scan Exposure System for 0.15 μm and 0.13 μm Technology Node?", *SPIE* vol. 3679, Mar. 1999, pp. 506-521.

T.A. Brunner, "Impact of Lens Aberrations on Optical Lithography", pp. 1-9.

J. van Schoot et al., "0.7 NA DUV Step & Scan System for 150nm Imaging with Improved Overaly", *SPIE* vol. 3679, Mar. 1999, pp. 448-456.

H. G. Müller et al., "Large Area Fine Line Patterning by Scanning Projection Lithography", pp. 100-104.

J.E. Bjorkholm et al., "Reduction Imaging at 14nm Using Multilayer-Coated Optics: Printing of Features Smaller than 0.1 μm", *J. Vac. ci. Technol.* B 8 (6), Nov./Dec. 1990, pp. 1509-1513.

B. E. Newnam et al., "Development of XUV Projection Lithography at 60-80 nm", *SPIE* vol. 1671, 1992, pp. 419-427.

W. H. Press et al., "Numerical Recipes The Art of Scientific Computing", pp. 52-64.

C. P. Ausschnitt, "Distinguishing Dose from Defocus for In-Line Lithography Conrol", *SPIE* vol. 3677, Mar. 1999, pp. 140-147.

G. M. Pugh, "Detailed Study of a Phase-Shift Focus Monitor", *SPIE* vol. 2440, pp. 690-700.

J.W. Gemmink, "A Simple and Calibratable Method for the Determinationo f Optimal Focus", *SPIE* vol. 1088, 1989, pp. 220-230.

J. P. Kirk, "Astigmatism and Field Curvature from Pin-Bars", *SPIE* vol. 1463, 1991, pp. 282-291.

M. Terry et al., "Gauging the Performance of An In-Situ Interferometer".

M. Dusa et al., "Photo-Lithographic Lens Characterization of Critical Dimension Variation Using Empirical Focal Plane Modeling", *SPIE* vol. 3051, Mar. 13, 1997, pp. 1-10.

J. H. Bruning, "Optical Lithography—thirty Years and Three Orders of Magnitude", *SPIE* vol. 3051, pp. 14-27.

"Quaestor Q7 Brochure", *Bio-Rad Semiconductor Systems*.

B. Lin, "the attenuated Phase-Shifting Mask", *Solid State Technology*, Jan. 1992, pp. 43-47.

T.A. Brunner et al., "Quantitative Stepper Metrology using the Focus Monitor Test Mask", *SPIE*, vol. 2197, pp. 541-549.

N. M. Ceglio et al., "Soft X-Ray Projection Lithography", *J. Vac. Sci. Technol.* B 8(6), Nov./Dec. 1990, pp. 1325-1328.

H. R. Huff et al., "Competitive Assessment of 200 mm Epitaxial Silicon Wafer Flatness", *SPIE* vol. 3332, pp. 625-630.

P. Dirksen et al., "Latent Image Metrology for Production Wafer Steppers", *SPIE* vol. 2440, pp. 701-711.

International Technology Roadmap for Semiconductors, 2001 Edition, *SEMATECH*, pp. 1-21.

G. Davies et al., "193 nm Step and Scan Lithography", pp. 1-15.

S. D. Hsu et al., "Controlling Focal Plane Tilt", pp. 1-5.

R.D. Mih et al., Using the Focus Monitor Test Mask to Characterize Lithographic Performance, *SPIE*, vol. 2440, pp. 657-665.

\* cited by examiner

Portion of reticle used for the exposures in Figure 8

APPARATUS AND PROCESS FOR DETERMINATION OF DYNAMIC LENS FIELD CURVATURE

BACKGROUND OF THE INVENTION

1. Field of the Invention

The present invention relates generally to processes for semiconductor manufacturing and more particularly to the area of optical lithography. Especially methods for the determination of focal plane deviation (FPD) associated with photolithographic projection systems.

2. Description of the Related Art

In order to produce sub-wavelength semiconductor patterned features (transistors, gates) with very tight process specifications lithography engineers continuously monitor focus during and after the optical lithography process. The ability to produce sub-wavelength features can often be determined by considering the rather simple (3-beam) Rayleigh scaling Resolution (R) ($\lambda/2NA$) and Depth-of-Focus (DoF) equations, $\sim\lambda/2NA$ and $\sim\lambda/2NA^2$. These coupled equations stress the inverse relationship between resolution and DoF based on the exposure wavelength ($\lambda$) and numerical aperture (NA). The semiconductor industry's requirement to produce smaller critical features over time has forced semiconductor manufacturers and lithography tool vendors to produce higher NA lithography systems (steppers or scanners) using exposure sources at smaller wavelengths (for example, 248 nm). The ability to control focus during the lithography process becomes more difficult as the DoF becomes smaller simply because image fidelity degrades quickly with focal changes. Poor lithographic imaging and poor product yields cause semiconductor manufacturing costs to rise and technology ramp to slow. Semiconductor lithographers have discovered creative reticle enhancement techniques (RETs) and other optical techniques to increase the useable DoF. See, for example, "The Attenuated Phase Shift Mask", B. Lin, FLEX like "Method and Apparatus for Enhancing the Focus Latitude in Lithography", Pei-Yang Yan, U.S. Pat. No. 5,303,002 issued Apr. 12, 1994. Despite these efforts, the problem remains. Therefore, it is important to monitor focus during photolithographic processing and develop new methods for focus control. Typically, focus error across a scanner field can be attributed to the following three terms: (1) wafer and reticle non-flatness, (2) dynamic wafer/reticle stage error, and (3) static or dynamic lens field curvature.

For a photolithographic scanner, dynamic lens field curvature varies in the cross scan direction (x) in rather complex ways. While many methods exist for determining and monitoring focal plane deviation (FPD) and best focus by field position for photolithographic exposure tools, these do not account for wafer non-flatness and scanner dynamics, independently of the lithographic process. See, for example, "Distinguishing Dose from Defocus for In-Line Lithography Control", C. Ausschnitt, *SPIE*, Vol. 3677, pp. 140-147, 1999; "Latent Image Metrology for Production Wafer Steppers", P. Kirksen et al., *SPIE*, Vol. 2440, pp. 701-711, 1995; "Controlling Focal Plane Tilt", S. Hsu et al., *Semiconductor International*, Apr. 1, 1998 (available on-line as of February 2004 at the URL of http://www.reed-lectronics.com/semiconductor/article/CA177590?pubdate=4%2F1%2F1999&spacedesc=webex); "Apparatus, Method of Measurement and Method of Data Analysis for Correction of Optical System", A. Smith et al., U.S. Pat. No. 5,828,455 issued Oct. 7, 1998; and "Apparatus, Method of Measurement and Method of Data Analysis for Correction of Optical System", A. Smith et al., U.S. Pat. No. 5,978,085 issued Nov. 2, 1999.

Lithography Process Control and Monitoring

A typical microelectronic device or circuit includes many (~20) levels or pattern layers. The fidelity and placement of patterned features on critical levels is often difficult to control. Lithographers typically use the following metrics to measure the success (or failure) of the lithographic patterning process: (1) critical dimension (CD), a measure of the critical device feature, (2) overlay error or feature position, as described above, and (3) side wall angle (SWA), the shape of side walls of the critical features. Each of these metrics is illustrated in FIG. 1a. These three metrics are typically measured using a scanning electron microscope (CD-SEM) or optical metrology tool (overlay tool). See, for example, "Quaestor Q7 Brochure", *Bio-Rad Semiconductor Systems*. Optical metrology tools are less expensive to operate as compared with a CD-SEM and are often used for process control (focus and exposure) applications, as well as overlay monitoring. See, for example, "Distinguishing Dose from Defocus for In-Line Lithography Control", supra.

Most overlay and CD measurements are made on silicon product wafers after each photolithographic process, prior to final etch. Product wafers cannot be etched until the photoresist features are imaged properly and meet the target process specifications (CD and SWA within process limits). Lithographic process engineers rely heavily on exposure tool alignment and focusing calibration procedures to help insure that the scanner is aligning and focusing images properly; poor focus monitoring techniques corrupt the scanner calibration database and degrades lithographic tool performance. See, for example, "193 Step nm and Scan Lithography", G. Davies et al., *Semi Tech Symposium*, Japan, 1998 and "Using the Focus Monitor Test Mask to Characterize Lithographic Performance", R. Mih et al., *SPIE*, Vol. 2440, pp. 657-666, 1995. In addition, lack of information concerning the magnitude of fixed errors (aberrations) corrupts process control and overlay modeling routines that try to model-out systematic and random lithographic error.

Over the past 30 years, the semiconductor industry has continued to produce faster (via smaller critical features) and more complex (greater functionality, dense patterning) circuits, year after year. The push to smaller feature sizes is gated by many physical limitations. As the critical dimensions of semiconductor devices approach 50 nm, the usable DoF will approach 100 nm. See, for example, "2001 ITRS Roadmap", SEMATECH, pp. 1-21, 2001. Continued advances in lithography equipment (higher NA systems, smaller wavelength exposure sources), RET, resist processing, and automated process (focus and exposure) control techniques will likely become more difficult and remain critical. See, for example, "2001 ITRS Roadmap", supra. Finally, while FPD measurement on a routine basis is important for lithographic process control, separating the FPD into correctable and non-correctable components is important for assessing the capability limits of advanced process control schemes.

Mathematical Description of Focusing Contributions

Dynamic lens field curvature (ZDLC) is that portion of total defocus due to the lens alone. It can be expressed as a weighted integral of the static lens field curvature as:

$$ZDLC(x) = \int_{-\frac{SH}{2}}^{SH/2} dy * wt(y) ZSLC(x, y) \quad \text{Equation (1)}$$

where:

ZSLC (x,y)=static lens field curvature over the scanned lens slot y=scan direction coordinate wt(y)=weighting function ~I (y), the intensity across the slot for DUV resists but is generally different for I-line resists in particular it will depend on the scan direction being more heavily weighted on the side of the slot height (+y or −y) where the scan begins.

SH=scanner slot height (FIG. 1b)

It should be noted that different illumination settings (conventional, strong annular, quadrupole, etc.) will generally have different illumination profiles 1(y) and therefore will have different ZDLC profiles.

While one could determine ZDLC by measuring or otherwise knowing wt(y) and ZSLC(x,y), it would be advantageous to directly determine ZDLC(x).

FPD: There are a number of methods that with greater or lesser accuracy measure defocus or focal plane deviation (FPD) over an exposure field. In general terms, each of these techniques estimate the focal error across the field using a variety of special reticle patterns (focusing fiducials, FF). In addition, some of these methods utilize the stepper or scanner wafer stage leveling and positioning system and/or optical alignment system to aide in the determination of FPD. See, for example, "Twin Scan 1100 Product Literature", ASML. The term "FPD" is a rather general term describing the complete focus error associated with the photolithographic stepper or scanner-deviations from the focal plane in reference to the wafer surface. Among other things, FPD can be caused by lens tilt, stage/reticle tilt, reticle bow, lens field curvature, and stage synchronization error. FIG. 3a shows a generic photolithographic leveling system. FIGS. 3b and 3c illustrate some common reticle patterns (e.g., the IBM Corporation Phase Shift Focus Monitor (PSFM), and the ASML FOCAL alignment mark) that are used to determine FPD for both steppers and scanners. Typically, FPD calibration/monitoring is performed daily or at least weekly to ensure that the stepper or scanner is operating within design limits (verifying the focus system works, the stage is level, etc.). While both techniques are widely accepted both techniques require complex calibrations to be performed at each field point. See, for example, "Detailed Study of a Phase-Shift Focus Monitor", G. Pugh et al., *SPIE*, Vol. 2440, pp. 690-700, 1995; and "Latent Image Metrology for Production Wafer Steppers", supra.

These FPD prior art methods are listed Table 1 below:

ISI (Litel): A method for determining the aberrations of an optical system is described in U.S. Pat. No. 5,828,455 to A. Smith supra and U.S. Pat. No. 5,978,085 to A. Smith supra. In these descriptions, a special reticle is used to determine the Zernike coefficients for photolithographic steppers and scanners. Knowing the wavefront aberration (Zernike coefficients and the associated polynomial) associated with the exit pupil of the projection system includes information about the lens field curvature or focus (Zernike coefficient a4, for example). A special reticle and a self-referencing technique are used to rapidly identify FPD to a high degree of accuracy and determine focusing errors to ~5 nm, even in the presence of scanner noise. This method automatically determines lens field curvature information for both static and dynamic exposure tools (steppers and scanners).

PSFM: A method (Phase Shift Focus Monitor) described in U.S. Pat. No. 5,300,786 supra, can be used to determine and monitor the focal plane deviation (FPD) associated with the lithographic process. More information can be found in the document "Detailed Study of a Phase-Shift Focus Monitor", referred to above. In general, an alternating PSM with phase close to 90° possesses unusual optical properties that can be exploited to measure focus errors. See, for example, "Quantitative Stepper Metrology Using the Focus Monitor Test Mask", T. Brunner et al., *SPIE, Vol.* 2197, pp. 541-549 and "Using the Focus Monitor Test Mask to Characterize Lithographic Performance", supra. It is generally possible to design a "box-in-box" overlay target using a phase shift mask pattern (called here a focusing fiducial; see FIGS. 3b and 3c), in which the measured overlay error is proportional to the focus error (see FIG. 5). Focal plane non-flatness is then determined by measuring the focusing fiducials across the lens field. Astigmatism information appears as differences between the delta-X overlay error and the delta-Y overlay error measurement. This technology has also been used for assessing variations in focus across the wafer due to lens heating, misfocusing near the edge of the wafer, and chuck/stage non-flatness. One major drawback with the PSFM method is that a fairly elaborate calibration procedure (focus offset vs. overlay shift for each field point) is required before it can be used, as the PSFM technique is rather sensitive to the source-sigma (i.e., NA-source/NA-objective) that varies from process to process. Additional PSM techniques, such as those described in "Focus Monitor for Alternating Phase Shift

TABLE 1

| Method | Measurement Type | Comment |
| --- | --- | --- |
| ISI (See, for example, U.S. Pat. No. 5,828,455, supra and U.S. Pat. No. 5,978,085, supra) | Absolute | Extremely accurate. |
| FOCAL (See, for example, "FOCAL, P. Dirksen et al., SPIE, Vol. 2440, p. 701, 1995) | Relative | Published version claims high absolute accuracy, resolution averaging in practice |
| IBM focus monitor (See, for example, "Optical Focus Phase Shift Test Pattern, Monitoring System and Process", T. Brunner et al., U.S. Pat. No. 5,300,786, Apr. 5, 1994) | Absolute | Requires 'calibration'. It is very process independent. |
| Schnitzl (See, for example, "Distinguishing Dose from Defocus for In-Line Lithography Control", supra) | Relative with one exposure | Complex calibration, varying target sensitivity, sign of focus ambiguous. |
| TIS (See, for example, "193 Step and Scan Lithography", supra and "Twin Scan 1100 Product Literature", supra) | Relative | Relies on wafer Z-stage, accuracy/repeat. |

Masks", L. Liebmann et al., U.S. Pat. No. 5,936,738 issued Aug. 10, 1999, are used in a similar way. While the PSFM method provides an FPD map across a scanner or stepper field it does not provide a method for determining the dynamic lens field curvature independent of wafer height variation in the presence of stage synchronization error. See, for example, "Comprehensive Focus-Overlay-CD Correlation to Identify Photolithographic Performance", Dusa et al., *SPIE, Vol.* 2726-2729, 1996.

FOCAL: A method (FOCAL—Focus determination using stepper alignment system) described by P. Dirksen et al. in "FOCAL", supra, specifies a focusing fiducial that can be used to find FPD and astigmatism across the exposure field (lens). FOCAL alignment marks (focusing fiducials) consist of modified wafer alignment marks that are measured using the stepper wafer alignment subsystem. See "Latent Image Metrology for Production Wafer Steppers" by P. Dirksen et al., *SPIE* Vol. 2440, 1995 at pp. 701-711. Defocus of the tool results in an apparent shift of the center of the alignment mark relative to that of the 'best focus' position. The FOCAL technique makes use of the exposure tool's alignment mechanism and therefore requires that the stepper or scanner be off-line for the length of the measurement sequence. FOCAL marks are sensitive to exposure and sigma like the PSFM method; however, since fiducial response is a function of pitch, the target features are less dependent upon reticle error. Furthermore, the FOCAL data (focus vs. overlay error) must be calibrated for every point in the exposure field similar to phase-shift monitors (typically at 121 points across an exposure field). Now, it is possible to use FOCAL to separate out lens tilt and astigmatism from dynamic FPD maps and provide a dynamic focal plane map, but wafer height variation and stage synchronization errors would still be included in the result. See, for example, "193 Step and Scan Lithography", supra, and "Comprehensive Focus-Overlay-CD Correlation to Identify Photolithographic Performance", Dusa et al., *SPIE*, Vol. 2726-2729, 1996.

Schnitzl Targets: A method described in "Distinguishing Dose from Defocus for In-Line Lithography Control", supra, makes use of line-end shortening effects to decouple focus drift from exposure drift on semiconductor product wafers. FIG. 3c shows a typical pair of Schnitzl targets (focusing fiducials). It is widely known that resist line-ends (FIG. 3c) are very sensitive (exhibit greater line-end shortening) to both focus and exposure drifts; the effect is further enhanced as the lithographic process is pushed near performance limit of the scanner tool ($\sim\lambda/2NA$). Using the Schnitzl targets and a fairly elaborate method of calibration (CD-SEM measurements and a coupled system of equations), Ausschnitt describes a method that can determine the magnitude of focus drift on product wafers using one or more exposures in the presence of exposure drift. Since changes in focus and exposure can produce similar changes in the critical dimension (CD), the Schnitzl method is useful for day-to-day process monitoring because it eliminates the need to constantly perform focus and exposure experiments (FEM—a Focus Exposure Matrix) in-between production runs. In addition, the method uses fast and accurate optical overlay tools to measure the Schnitzl patterns (in several forms, CD targets or Overlay targets, FIG. 3b) after wafer processing, this saves monitoring costs because optical overlay tools are less expensive to operate as compared with a CD-SEM. While decoupling focus drift from exposure drift is useful for process monitoring, the method in its present form requires two exposures at different focus settings to determine the absolute focal drift (direction). Performing extra exposures during production runs is very costly. In addition, since the initial Schnitzl target calibration procedure depends on a number of lithographic tool settings (line size, pitch, sigma, NA) re-calibration is required for each lithographic process change—including changes in metrology tools. The Schnitzl focusing fiducials are often used to map out FPD across a stepper or scanner field, but methods similar to those described in "Comprehensive Focus-Overlay-CD Correlation" by Dusa, supra, would need to be implemented to obtain a dynamic focus map. Nevertheless, wafer height variation and scanning dynamics are not considered in the discussion.

Summarizing:

We have described several methods for determining FPD. Common to all of these methods is that a feature (focusing fiducial or FF) is printed on a wafer and the focusing fiducial subsequently measured. The data from the focusing fiducial is processed and an FPD value, $\delta Z$, determined. Further, and common to all these methods, the contributions of wafer height, lens aberrations (in the form of lens field curvature), and stage synchronization are not resolved into their distinct components.

SUMMARY

Dynamic lens curvature (ZDLC) is determined within a piston and tilt term in the presence of other sources of focal error.

A process for the determination of dynamic lens field curvature uniquely associated with a photolithographic scanner is described. A series of lithographic exposures is performed on a resist coated silicon wafer using a photolithographic scanner. The lithographic exposures produce an array of focusing fiducials that are displaced relative to each other in a unique way. The focusing fiducials are measured and the resulting measurements are fed into a computer algorithm that determines the dynamic lens field curvature (ZDLC) perpendicular to the scanning direction in an absolute sense. Furthermore, the effects of wafer flatness, wafer surface non-uniformity, and stage error are considered. The ZDLC information can be used to improve the image fidelity and overlay error uniquely associated with the photolithographic tool using several methods, including advanced process control routines that account for systematic and random lithographic error.

Other features and advantages of the present invention should be apparent from the following description of the preferred embodiment, which illustrates, by way of example, the principles of the invention.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction the accompanying drawings in which:

DETAILED DESCRIPTION

A process for the determination of dynamic lens field curvature uniquely associated with a photolithographic scanner described. A series of lithographic exposures is performed on a resist coated silicon wafer using a photolithographic scanner. The lithographic exposures produce an array of focusing fiducials that are displaced relative to each other in a unique way. The focusing fiducials are measured and connected to an FPD value. The resulting measurements are fed into a computer algorithm that calculates the dynamic lens field curvature in an absolute sense in the presence of wafer height variation and other wafer/reticle stage irregularities.

In accordance with the invention, ZDLC is determined by using particular arrangements and exposure patterns of "focusing fiducial" (FF) structures that measure the focal plane deviation (FPD).

The term $\delta Z(x,Y)$ is defined herein as the net focal deviation, or focal plane deviation (FPD), at a wafer plane located at (x, y). This can be determined a variety of ways. We can decompose $\delta Z(x, y)$ into contributions from the lens, the scan, and the wafer as:

$$\delta Z(x,y) = ZL(x) + ZS(y) + x*\theta(y) + ZW(x,y) \quad \text{(Equation 1.1)}$$

Where a continuous field position (x, y) is used and:
- ZL(x)=dynamic lens field curvature=contribution from lens.
- ZS(y)=dynamic scan piston. This is a moving average of instantaneous piston and pitch.
- $\theta$(y)=dynamic scan roll. This is a moving average of instantaneous scanner roll.
- ZW(x,y)=wafer height variation over the scan field.

Detailed Derivation of Dynamic Scan Height Functional Dependence

Figure 1A:
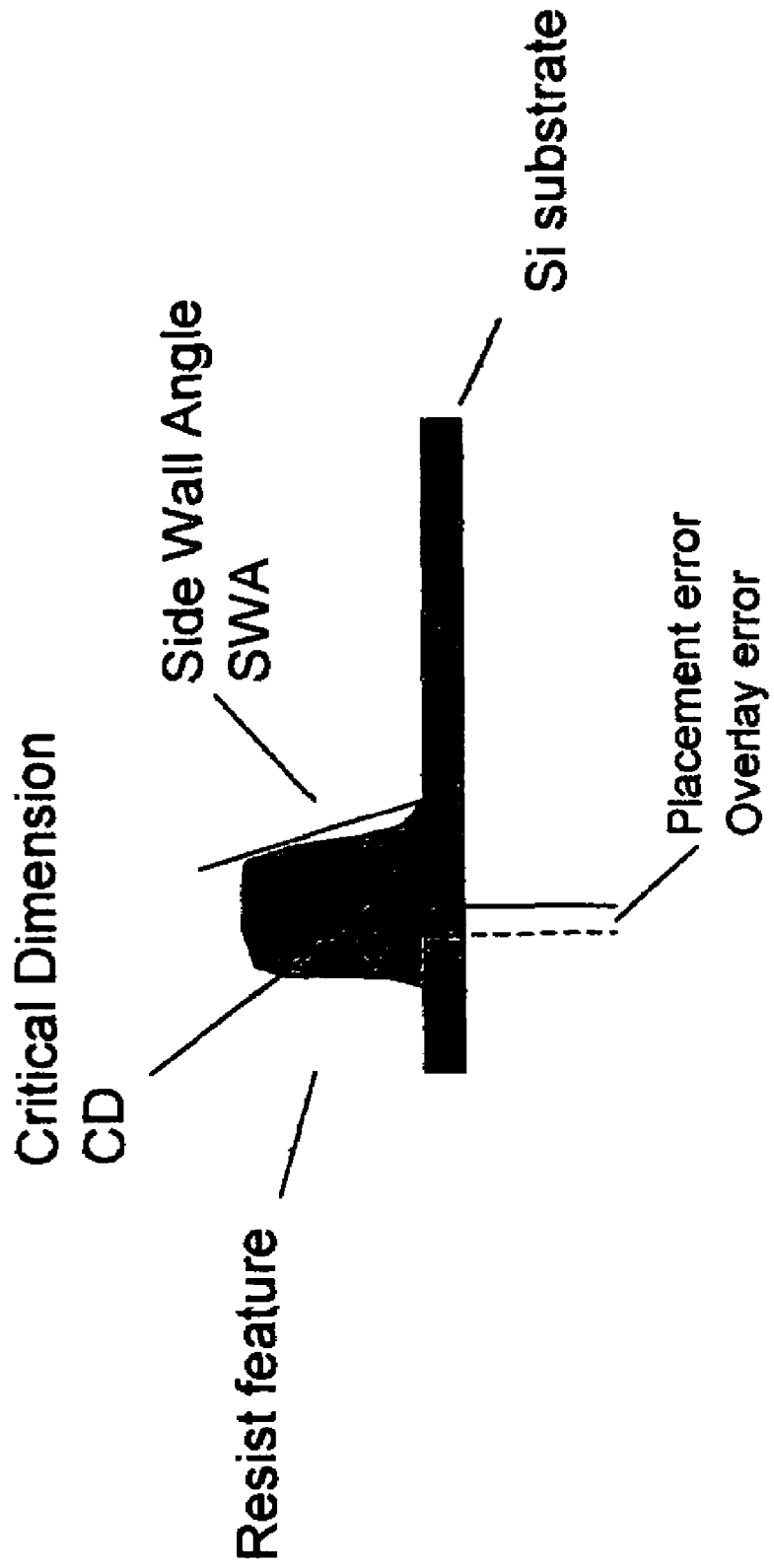
FIG. 1a illustrates several lithographic metrics.
Figure 1B:
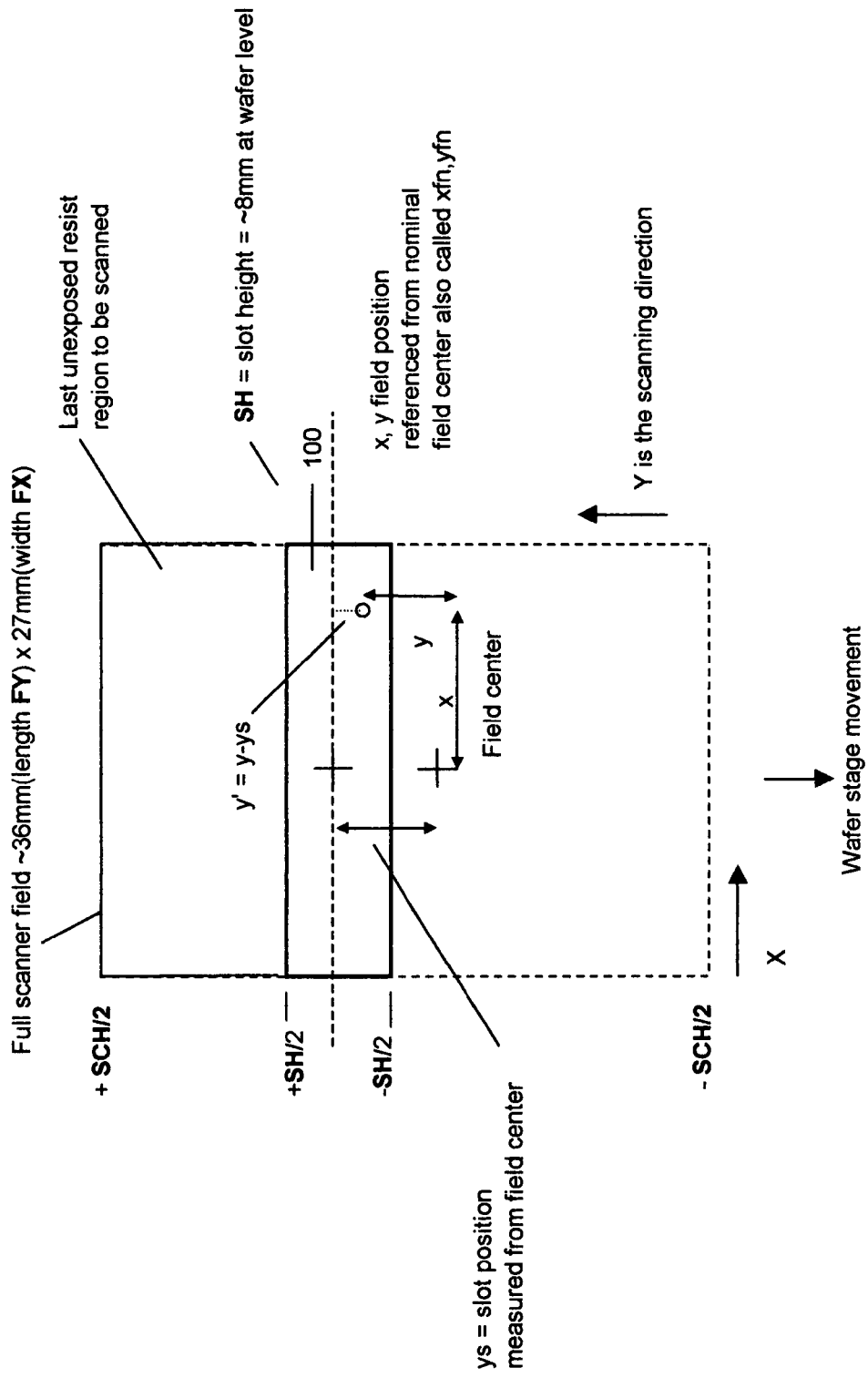
FIG. 1b shows a typical scanner exposure field and scanner coordinate system for the present invention.
Figure 2B:
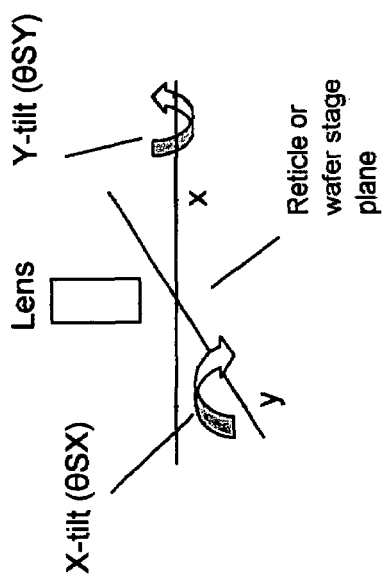
FIG. 2b shows scanner pitch and roll.
Figure 2A:
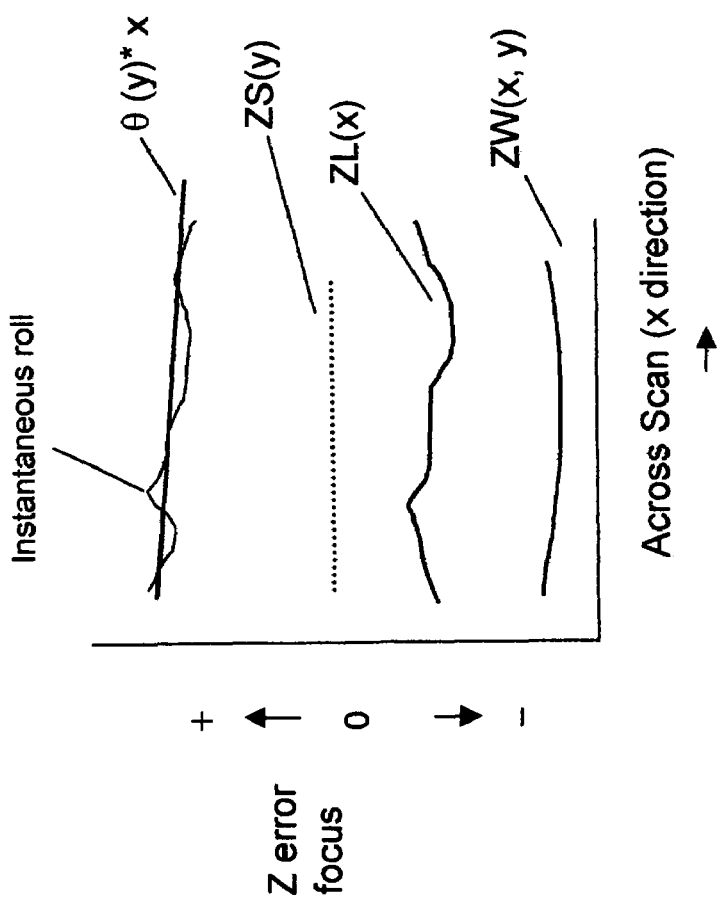
FIG. 2a shows scanner focal error components.
Figure 3B:
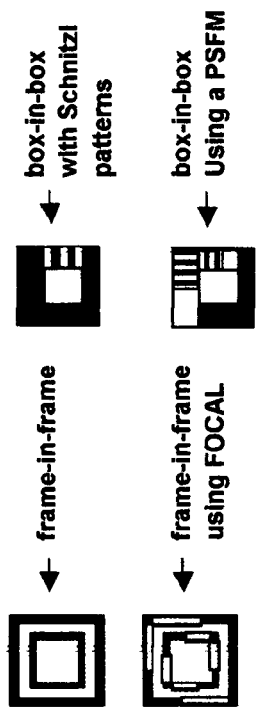
FIG. 3b shows prior art overlay targets with FOCAL, PSFM and Schnitzl versions.
Figure 3A:
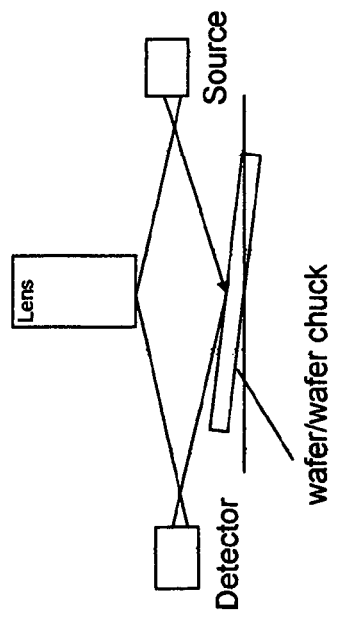
FIG. 3a shows a generic scanner tool leveling system with optics and sensors.
Figure 3C:
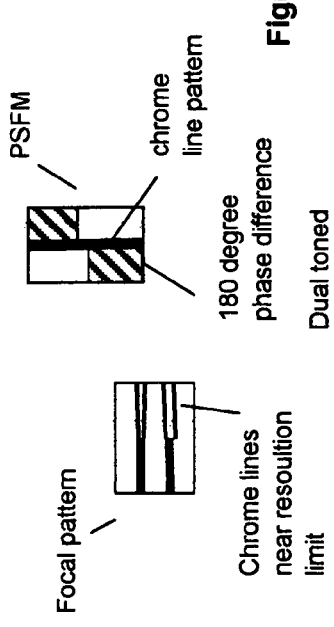
FIG. 3c shows FOCAL, PSFM, and Schnitzl details.
Figure 3C:
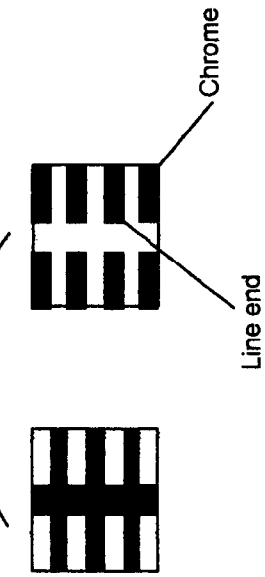

The dynamic scan synchronization as represented by ZS(y) and $\theta$(y) is readily derived and can best be understood by referring to FIG. 1b. There, the instantaneous position of the scanning slot (100) has a central value in the y or scanning direction equal to ys. At a position (x,y) in the scanned field, when the instantaneous position of the slot center is ys, the instantaneous height of the stage (ZSI) is:

$$ZSI(x,y;ys) = ZSH(ys) + \theta SX(ys)*x + \theta SY(ys)(y-ys) \quad \text{(Equation 1.2)}$$

where:

$ys$ = instantaneous slot height position relative to field center −

$\frac{1}{2}(SCH+SH) : \frac{1}{2}(SCH+SH)$ range

= coordinate that determines the instantaneous scanner height and tilt

ZSH(ys)=instantaneous height of stage
$\theta$SX (ys)=instantaneous x-tilt or scanner roll
$\theta$SY (ys)=instantaneous y-tilt or scanner pitch It should be noted that ZSH, $\theta$SX, $\theta$SY are due to mechanical synchronization errors in the Z-direction, and generally vary from scan to scan.

The scanner induced height or focus variation is the weighted average:

$$ZSC = ZSC(x, y) \quad \text{(Equation 1.3)}$$

$$= \int_{-\frac{SH}{2}}^{SH/2} \frac{dy'}{SH} wt(y') \cdot ZS[x, y; y-y']$$

$$= \int_{-\frac{SH}{2}}^{\frac{SH}{2}} \frac{dy'}{SH} wt(y') ZSH(y-y') +$$

$$x \cdot \int_{-\frac{SH}{2}}^{\frac{SH}{2}} \frac{dy'}{SH} wt(y') \theta SX(y-y') +$$

$$\int_{-\frac{SH}{2}}^{\frac{SH}{2}} \frac{dy'}{SH} wt(y') \theta SY(y-y') y'$$

$$= ZS(y) + x \cdot \theta(y)$$

The weight function, wt(y') is generally proportional to the intensity I(y') along the scan direction.

Several different embodiments of systems constructed in accordance with the invention will be described. For purposes of discussion, each of these will be referred to as "main embodiments", although it should be noted that the embodiments comprise alternative constructions of systems that implement the teachings described herein.

Discussion of First Main Embodiment

In accordance with the invention, Focusing Fiducials (FF) are exposed on a wafer in such a manner that the effects of wafer height variations can be isolated and eliminated, and a true measure of dynamic lens field curvature (ZDLC) can be obtained.

Figure 4:
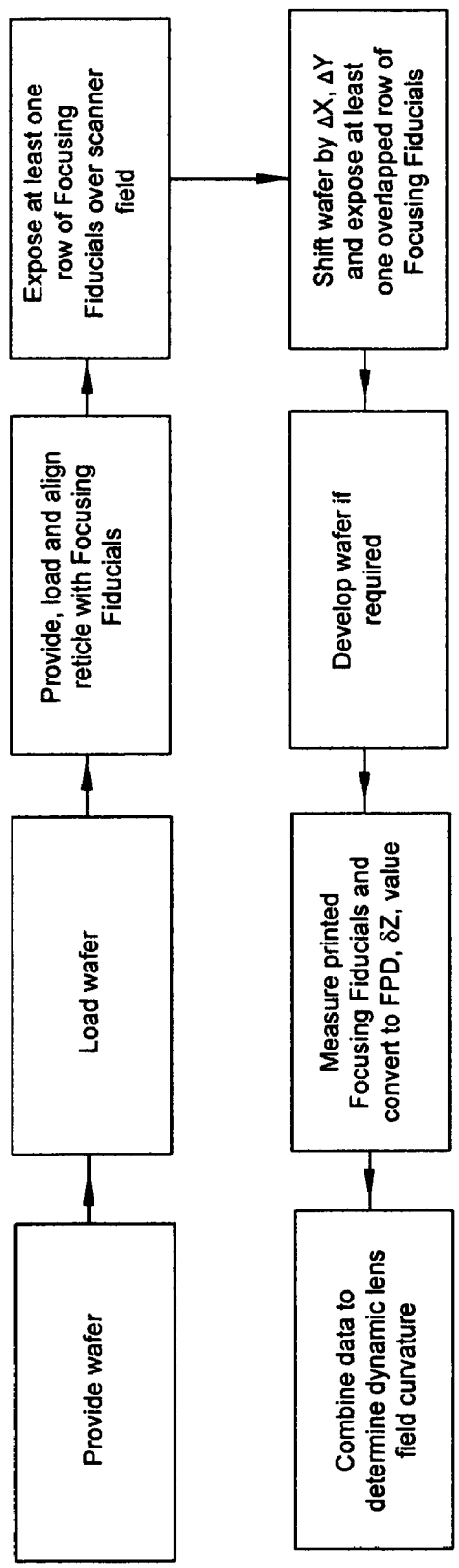
FIG. 4 shows the process flow for the first main embodiment of this invention.
Figure 5:
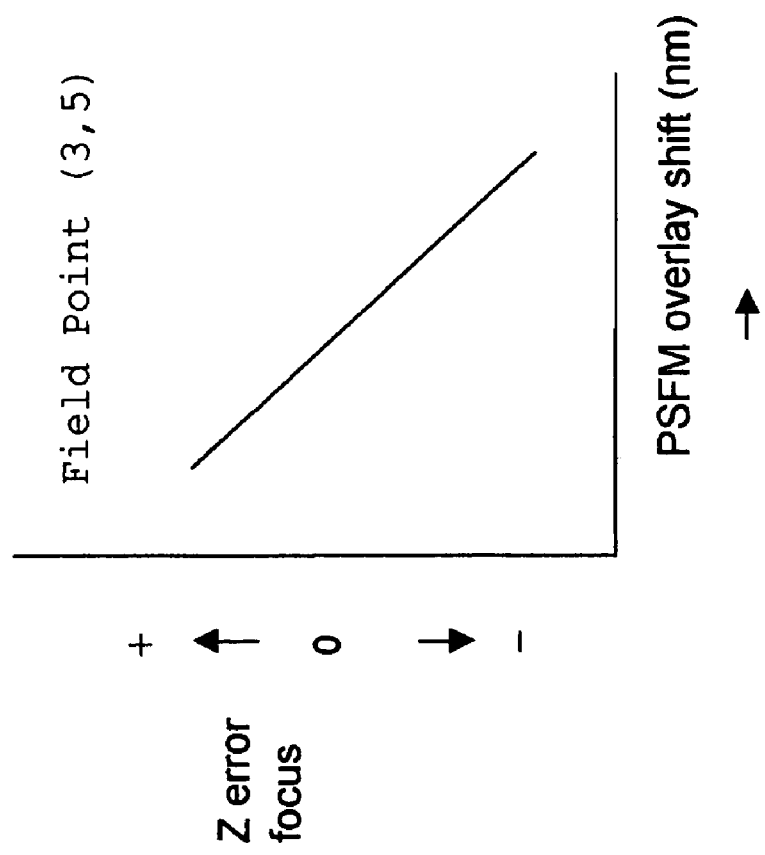
FIG. 5 shows a PSFM plot of focus vs. overlay shift for one field point.
Figure 6:
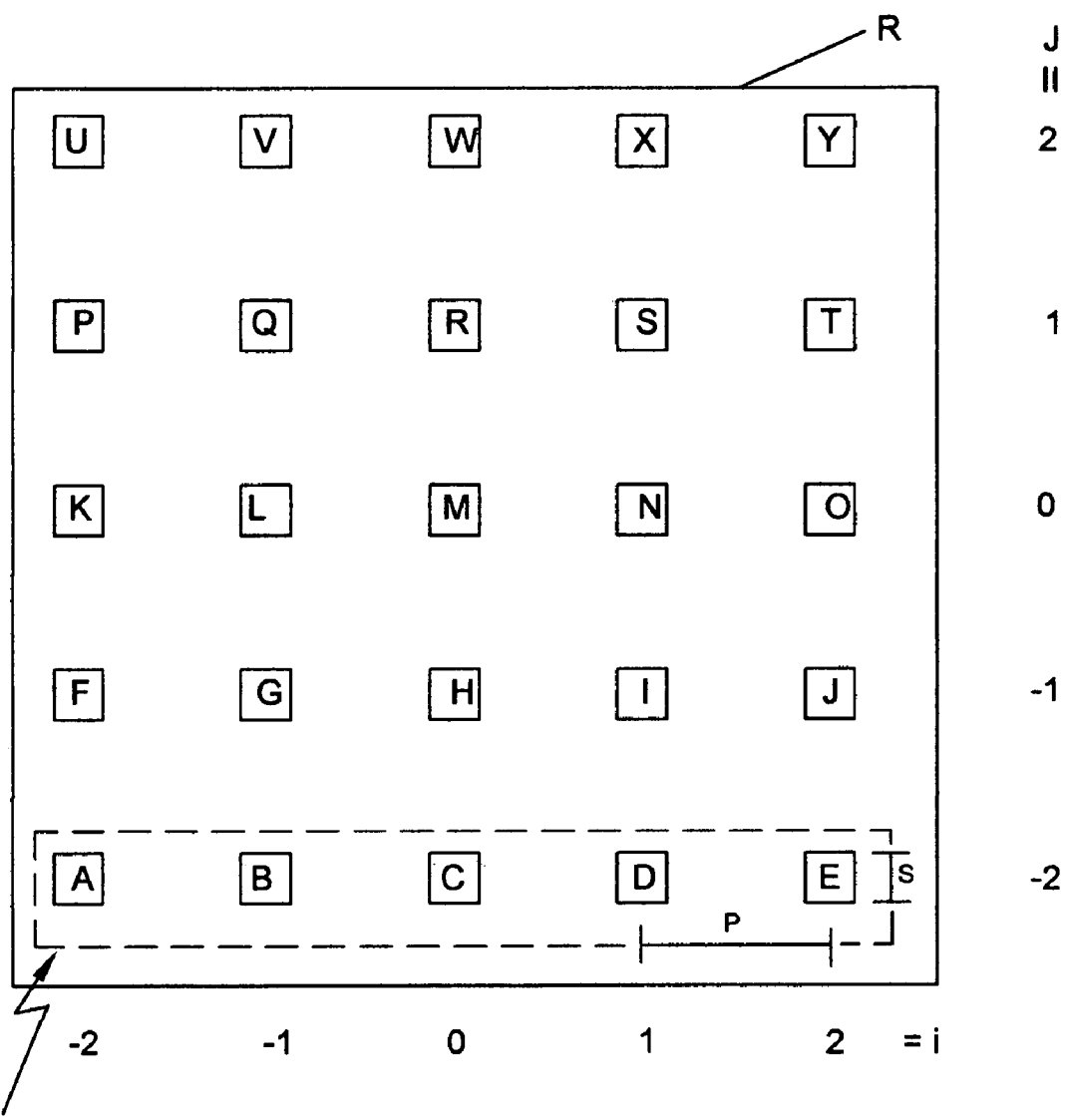
FIG. 6 shows a schematic of the focusing fiducial reticle used to carry out exposures.

A process flow diagram for the first Main Embodiment is shown in FIG. 4. The flow diagram shows the operations performed for a scanner in a lithographic projection imaging system constructed in accordance with the invention. A schematic diagram of a reticle containing a (5×5) array of focusing fiducials for the projection imaging system is shown in FIG. 6.

1. Provide Wafer

In the first operation, a resist coated wafer is provided. A bare wafer with no wafer alignment marks can be used.

2. Load Wafer

The wafer is then loaded onto the wafer exposure chuck of the projection scanner being interrogated.

3. Provide, Load and Align Reticle

A focusing fiducial reticle is provided. The exact form taken depends on the technology employed, but reticles are schematically represented in FIG. 6 as a (5×5) array of focusing fiducials (FF) on a pitch or spacing equal to P. The size or extent of each individual FF is "S". The reticle is loaded and aligned on the scanner.

4. First Exposure

Figure 7:
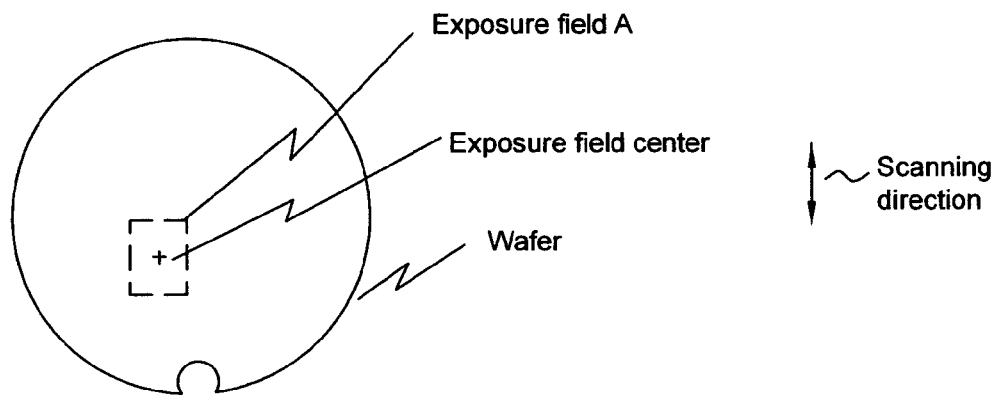
FIG. 7 shows an exposed field on a wafer.
Figure 8:
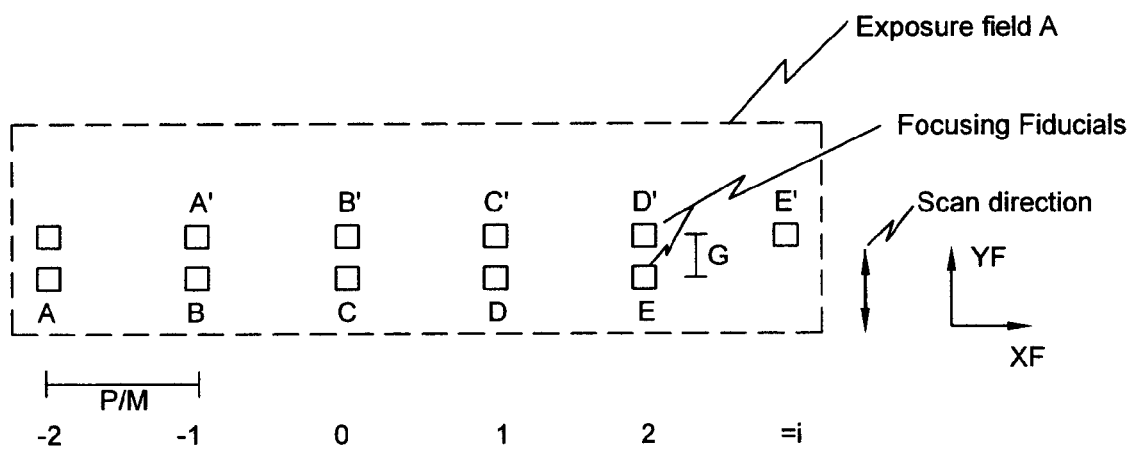
FIG. 8 is a close-up schematic of exposed field A after the second exposure.

In the next operation shown in FIG. 4, the reticle (R) containing an array of focusing fiducials (FF) has at least 1-row exposed onto a wafer-forming exposure field, indicated as "A" (see FIG. 7). Referring to FIG. 8, the wafer view of the exposed field A is shown, as well as focusing fiducials (A:E) that were put down with this first exposure. This dynamic exposure was made at field center position (XWI, YWI) on the wafer. The transverse or x position within the field, XF, is indicated by the index i and is given by:

$$XF(i) = \frac{P}{M} * i \qquad \text{(Equation 1.4)}$$

The direction of XF is shown in FIG. 8.

5. Second Exposure

The wafer is now dynamically exposed with the field center shifted a distance G from the first exposure. FIG. 8 shows the field after the second exposure. Focusing Fiducials A'E' were put down by this second exposure. The offset G is chosen so the focusing fiducials remain distinct and useable (G>S/M) but the wafer flatness does not vary significantly over an interval of the size G. Since G is typically <1 mm at the wafer, only the higher frequency spatial variations contribute. Since the power spectral density of wafer flatness falls off rapidly at higher spatial frequencies, the variation over sizes <1 mm will typically be small (~10 nm). See, for example, "Future Wafer Flatness Metrics", M. Boonman). In FIG. 8, the wafer center for the second exposure was centered at $$\left(XWI + \frac{P}{M}, YWI + G\right).$$

Also in FIG. 8, the four focusing fiducial pairs (A', B), (B', C), (C',D), and (D',E) constitute the overlapped row.

6. Develop Wafer

The wafer is now developed, if appropriate. In the case of technologies that utilize the latent image, this step may be omitted. See "Latent Image Metrology for Production Wafer Steppers", supra. Also, after development, the wafer may be etched and the photoresist stripped to improve the quality of the focusing fiducials.

7. Measure Focus Fiducials

At this point, the focusing fiducials are measured and the data is converted to an FPD value given by $\delta Z$. For example, using ISI technology, if each FF was a box-in-box array exposed using a large pinhole aperture plate as described in U.S. Pat. No. 5,828,455 supra, and U.S. Pat. No. 5,978,085 supra, then after measuring each box-in-box array, we could determine the Zernike coefficient a4 and thereby infer the FPD:

$$\delta Z = \frac{dz}{da4} a4 \qquad \text{(Equation 1.5)}$$

See, for example, "Gauging the Performance of an In-Situ Interferometer", M. Terry, et al.). Denote the first exposure focusing fiducial FPD values as:

$$\delta Z_i \qquad \text{(Equation 1.6)}$$

where i=−mx:mx=−2:2 in FIG. 8 or A:E. Likewise, the FPD values corresponding to the FFs of the second exposure are:

$$\delta Z 2_i \qquad \text{(Equation 1.7)}$$

where i=−mx+1:mx+1=−1:3 in FIG. 8 for FFs A':E'.

Now, $\delta Z(X,Y)$ can be decomposed into contributions from the lens, the scan, and the wafer as indicated in Equation 1.1.

$$\delta Z(x,y) = ZL(x) + ZS(y) + x*\theta(y) + ZW(x,y) \qquad \text{(Equation 1.8)}$$

This decomposition will be utilized below.

8. Determine Dynamic Lens Field Curvature

At the last (eighth) step shown in FIG. 4, the measured FPD values are combined with $\delta Z1_i$, $\delta Z2_i$ to determine the dynamic lens field curvature, $ZL_i$ and wafer height deviation $ZW_i$. Referring to FIG. 8 and using the discrete index i, we can express $\delta Z1_i$, $\delta Z2_i$ as:

$$\delta Z1 = ZL_i + ZW + ZS1 + i*\frac{P}{M}\theta 1 \qquad \text{(Equation 1.9)}$$
$$i = -mx:mx$$

$$\delta Z2_i = ZL_{i-1} + ZW_i + ZS2 + (i-1)\frac{P}{M}\theta 2 \qquad \text{(Equation 1.10)}$$
$$i = -mx + 1:mx + 1$$

where:

$ZW_i$=wafer height contribution at site i $ZS1,\theta 1$=dynamic scan piston and roll for the first exposure $ZS2,\theta 2$=dynamic scan piston and roll for the second exposure P=FF pitch on the reticle M=projection imaging reduction magnification ratio (typically=4).

mx=exposure extent (=2 in FIG. 8).

Now we solve Equations 1.9 and 1.10. The quantities $\delta Z1_i$, $\delta Z2_i$ are the measured FPDs from the focusing fiducials (vide supra) while the other quantities on the right hand side of Equations 1.9 and 1.10 are unknown. The solution is obtained using the singular value decomposition. See, for example, "Numerical recipes, The Art of Scientific Computing", W. Press et al., *Cambridge University Press*, pp. 52-64 and pp. 509-520, 1990. There are three modes of $ZL_i$ (piston, tilt, and quadratic) that are undetermined. Mathematically, the true dynamic lens distortion $ZL_i$ can be written as:

$$ZL_i = ZL_i^* + a + bi + ci^2$$
$$i = -mx:mx \qquad \text{(Equation 1.11)}$$

where $ZL_i^*$ is the ZL determined from solving Equations 1.9 and 1.10 and then removing the piston, tilt, and quadratic modes and a, b, c are the undetermined (unknown) piston, tilt, and quadratic modes, respectively. Likewise, the wafer flatness $ZW_i$ i=−mx:mx is determined to within a piston, tilt, and quadratic mode. Mathematically, this can be written as:

$$ZW_i = ZW_i^* + a' + b'i + c'i^2$$

$$i = -mx:mx \quad \text{(Equation 1.12)}$$

where $ZW_i^*$ is the numerically determined wafer flatness with piston, tilt, and quadratic modes removed, $ZW_i$ the true wafer flatness and a', b', c' the unknown constants.

Figure 9:
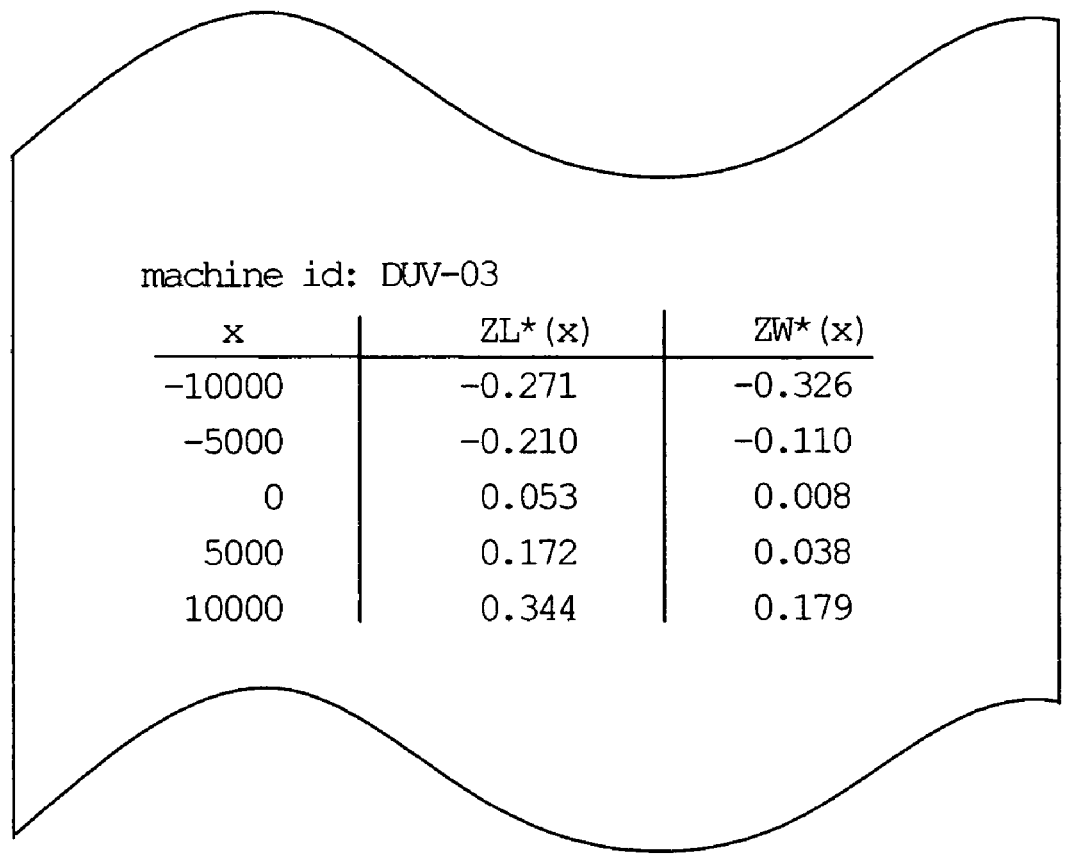
FIG. 9 shows the final results of the method of this invention.
Figure 10:
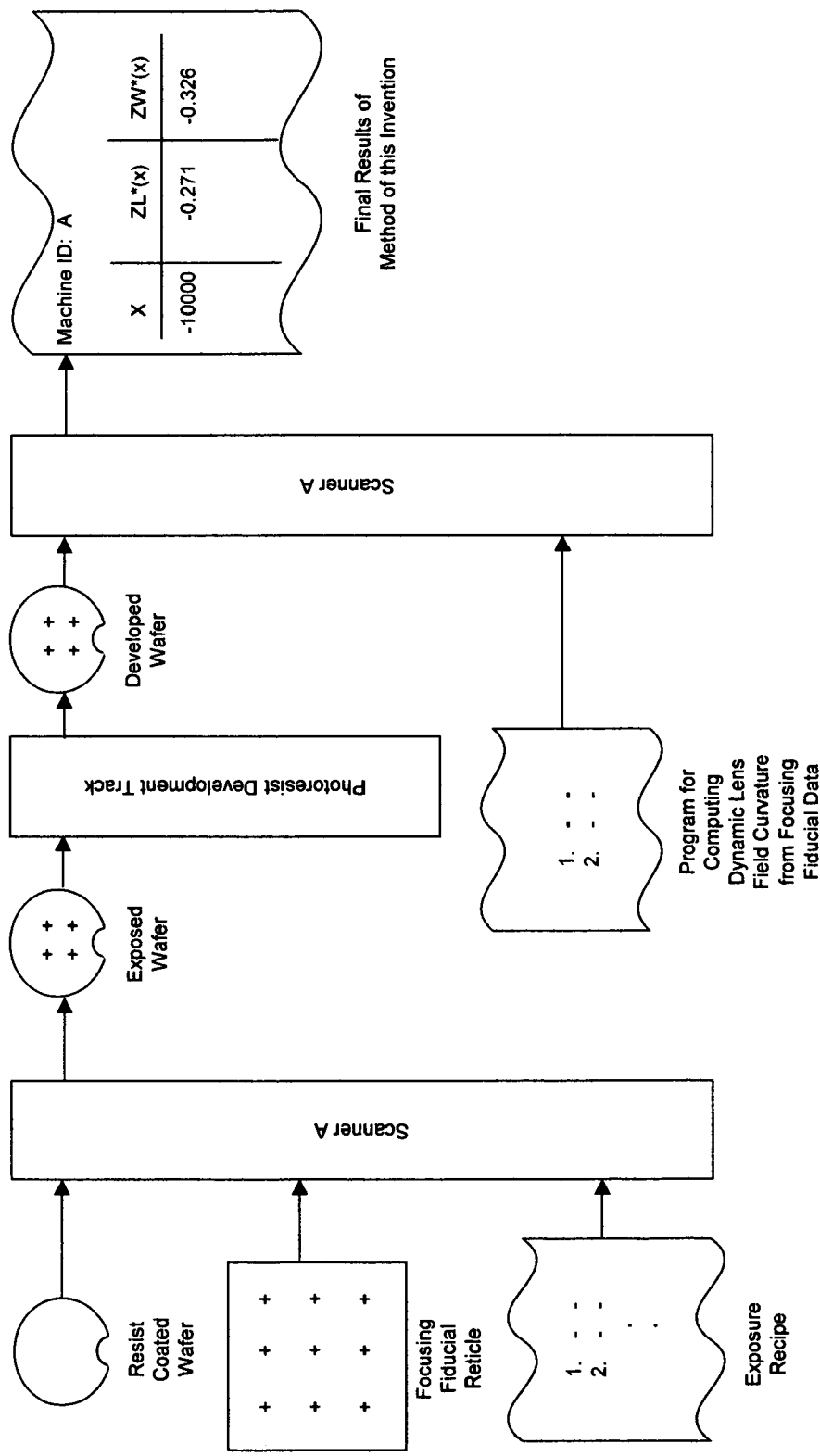
FIG. 10 is a block diagram illustrating a technique for processing the final output.

FIG. 9 shows the final output of the processing, indicating ZL* and ZW* values as a function of X values symmetric about zero. FIG. 10 is a block diagram illustrating a technique for processing the final output. In the example illustrated in FIG. 10 a scanner diagnoses itself for defects in dynamic field curvature. The dynamic field curvature information can then be used to correct the scanner, for example, the scanner field curvature can be adjusted in response to the information. As illustrated in FIG. 10 a resist coated wafer is loaded onto a scanner. A reticle with focusing fiducials is also loaded onto the scanner. The scanner is then programmed to expose the focusing fiducials onto the wafer in accordance with a predetermined recipe from the method of this invention. After the wafer has the desired pattern exposed on it, the exposed wafer is sent through a photoresist track and developed. The developed wafer with the pattern of focusing fiducials is then loaded onto the scanner. The scanner computes dynamic lens field curvature from the focusing fiducial data measured using the scanner (Scanner A in FIG. 10) in accordance with a program for operation as described above. The scanner then outputs the ZL* and ZW* values as a function of X values.

Figure 11:
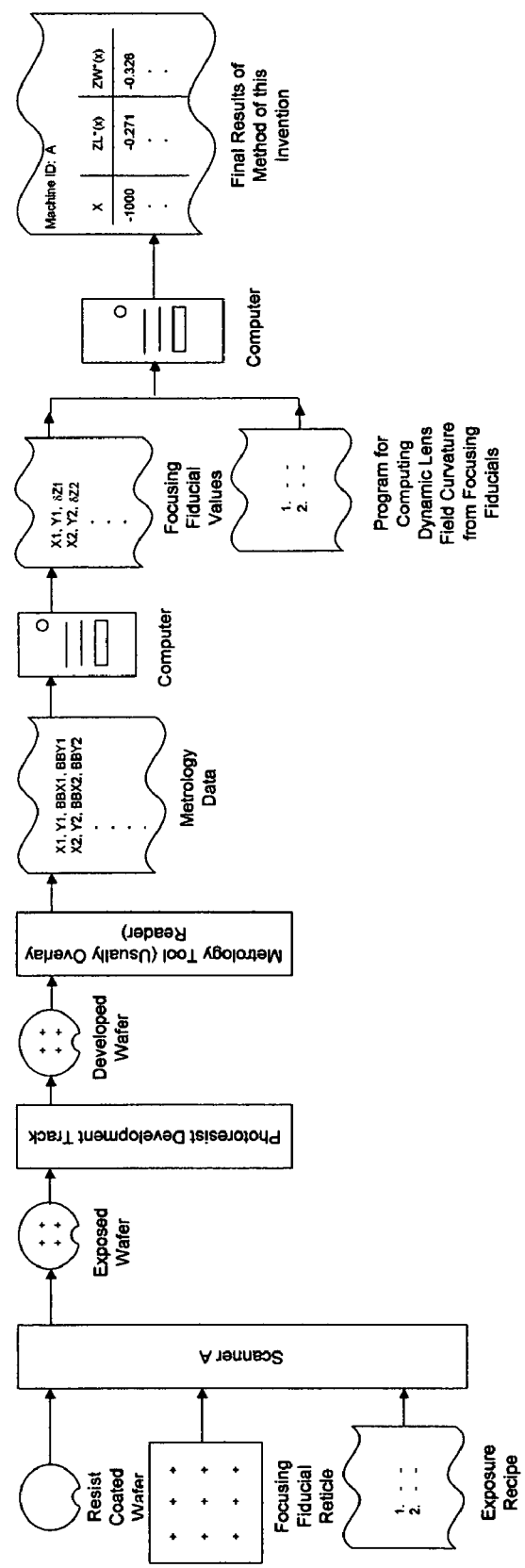
FIG. 11 is a block diagram illustrating another technique for processing the final output.

FIG. 11 is a block diagram illustrating another technique for processing the final output. In a manner similar to that described in FIG. 10, a resist coated wafer and a reticle with focusing fiducials are loaded onto a scanner. The focusing fiducials are then exposed onto the wafer in accordance with a predetermined recipe from the method of this invention. The exposed wafer is sent through a photoresist track and developed. In this technique, the developed wafer with the pattern of focusing fiducials is then loaded onto a metrology tool, such as an overlay reader. The metrology tool measures the developed fiducials and outputs metrology data that is fed into a processor or computer that converts the raw metrology data into focusing fiducial values. Another (or possibly the same) computer processes the metrology data to generate focusing fiducial values. The focusing fiducial values are used by the computer that is programmed to compute dynamic lens field curvature. This computer then outputs the ZL* and ZW* values as a function of X values.

Second Main Embodiment

Figure 12:
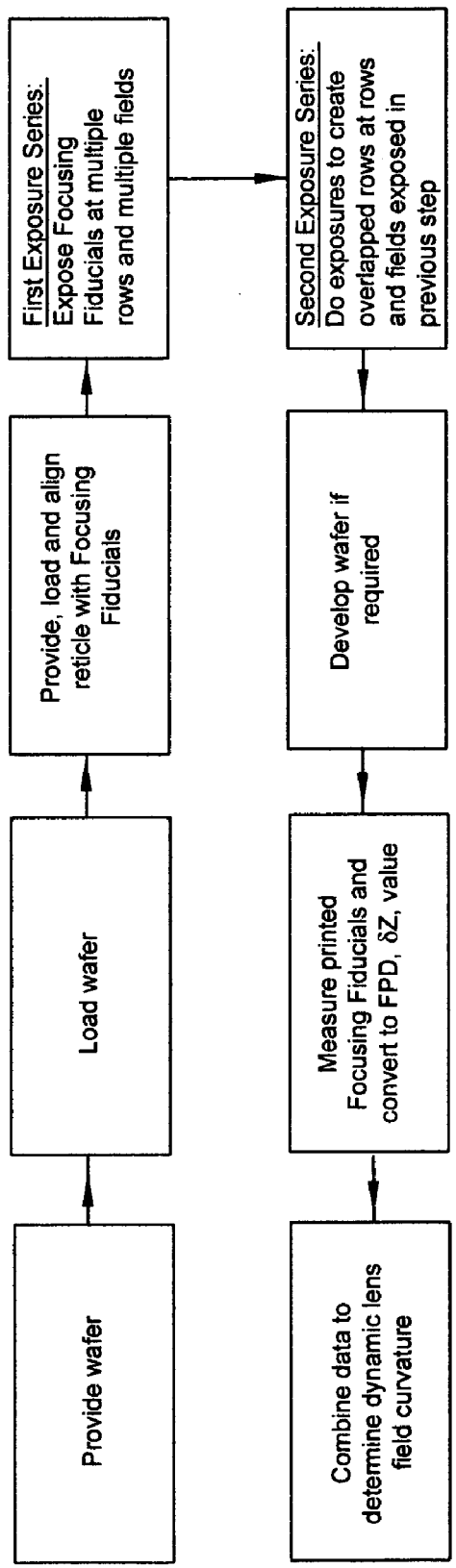
FIG. 12 shows the process flow for the second main embodiment of this invention.

The process operations for the second main embodiment in accordance with the invention are as shown in FIG. 12. This embodiment permits determination of ZDLC to within a piston and tilt value.

Provide Wafer, Load Wafer, and Provide, Load, Align Reticle

The first three operations for the second Main Embodiment as shown in FIG. 12 (listed as "provide wafer", "load wafer", and "provide, load, and align reticle") are the same as the corresponding operations in the first Main Embodiment described above. The first and second Main Embodiment differ in the subsequent operations, beginning with the exposure operation:

First Exposure Series

Figure 13:
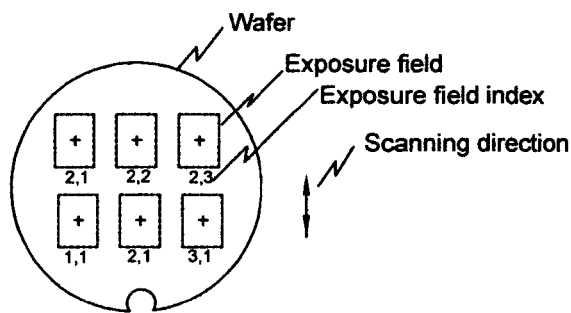
FIG. 13 shows exposed fields on the wafer for the second main embodiment of this invention.
Figure 14:
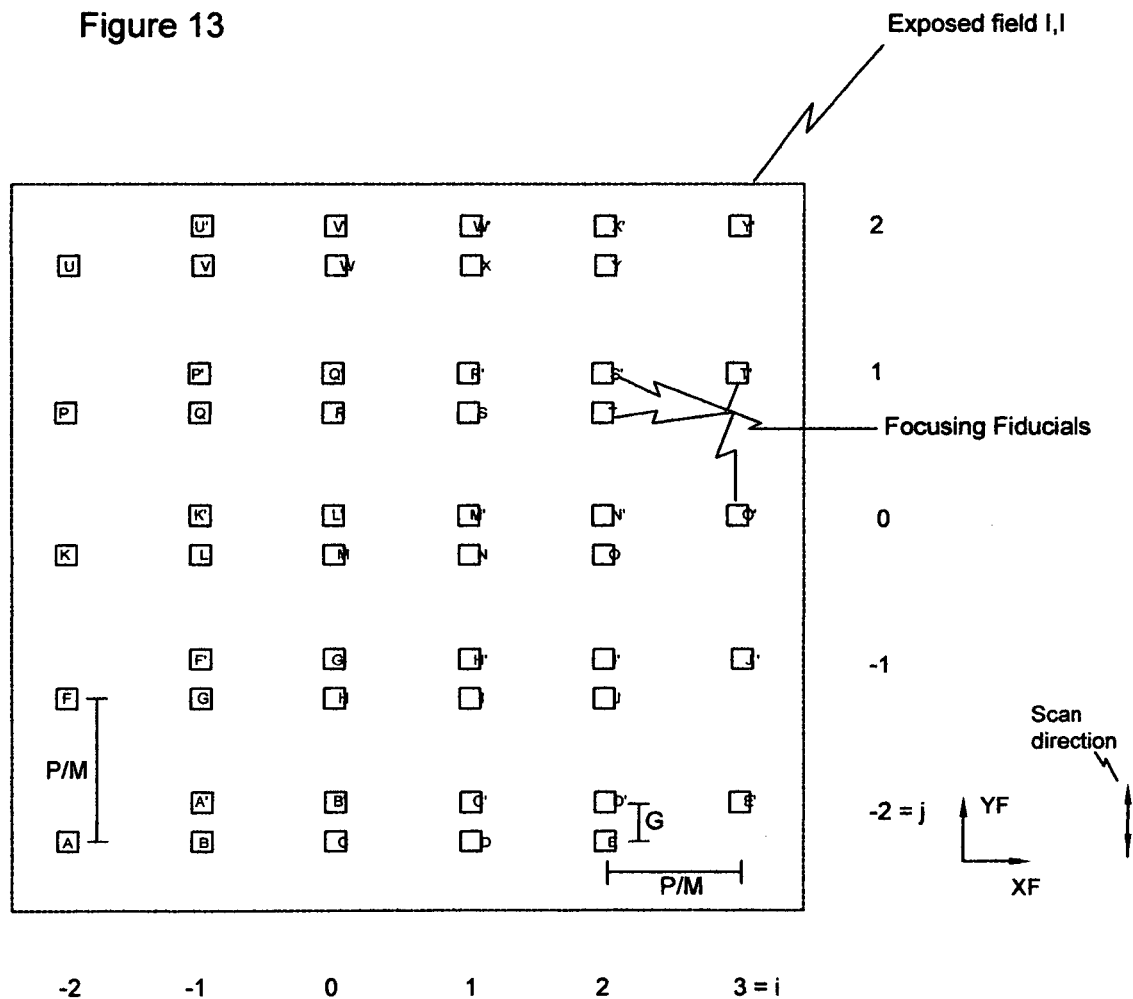
FIG. 14 shows a close-up schematic of a field after the second exposure series.

The reticle (R) of FIG. 6 is exposed dynamically in a 2mx+1×2my+1 array at multiple fields on the wafer (FIG. 13, mx=my=2). If Nf fields (Nf=6 in FIG. 13) are exposed, a total of (2my+1)*Nf rows will be created on the wafer. Referring to FIG. 14, a detailed view of exposure field 1,1 is provided. In FIG. 14, the focusing fiducials A:Y are created in this first exposure series.

Second Exposure Series

The wafer is now dynamically exposed, but the center of each exposed field is shifted by an amount $$(\Delta x, \Delta y) = \left(\frac{P}{M}, G\right)$$

from the first exposure series. Offset G is as described in the first Main Embodiment above. In FIG. 14, the focusing fiducials put down in the second exposure series are A':Y' and the five overlapped rows constitute the FF pairs:

j=−2 FF overlapped row (A', B), (B', C), (C', D), (D', E)
j=−1 FF overlapped row (F', G), (G', H), (H', I), (I', J)
j=0 FF overlapped row (K', L), (L', M), (M', N), (N', O)
j=+1 FF overlapped row (P', Q), (Q', R), (R', S), (S', T)
j=+2 FF overlapped row (U', V), (V', W), (W', X), (X', Y)

The overlapped rows will be similar on the other fields.

Develop Wafer

The wafer is now optionally developed. In the case of technologies that utilize the latent image, this step may be omitted. See, for example, "Latent Image Metrology for Production Wafer Steppers", supra. Also, after development, the wafer may be etched and the photoresist stripped to improve the quality of the focusing fiducials.

Measure Focusing Fiducials

At this point, the focusing fiducials are measured and the results converted into two arrays of FPD values δZ1, δZ2 (i, j; if, jf) of the first, second exposure, where:
  i=−mx:mx+1 intrafield indices along XF direction
  j=−my:my intrafield row indices, YF direction
  if, jf=field indices, different for each exposed field Then, and referring to FIG. 14 and Equations 1.9 and 1.10, we can express δZ1, δZ2 as given by Equation 1.13:

$$\delta Z1(i, j; if, jf) = ZL_i + ZW(i, j; if, jf) + \quad \text{(Equation 1.13)}$$
$$ZS1(j; if, jf) + i * \frac{P}{M} \theta 1(j; if, jf)$$

$i = -mx:mx$
$j = -my:my$
$if, jf = \text{all fields}$ and $$\delta Z2(i, j; if, jf) = ZL_{i-1} + ZW(i, j; if, jf) + \quad \text{(Equation 1.14)}$$
$$ZS2(j; if, jf) + (i-1)\frac{P}{M} \theta 2(j; if, jf)$$

$i = -mx+1:mx+1$
$j = -my:my$
$if, jf = \text{all fields}$ where all the symbols have the same meaning as before but, with the important exception of ZL, they depend on row number j and field position if, jf. Now Equations 1.13 and 1.14 can be solved for the unknown quantities ZL, ZW, ZS1, ZS2, θ1, θ2 as in the first Main Embodiment. The result is that in the absence of measurement error, $ZL_i$ is perfectly determined for modes above quadratic, and the quadratic mode is determined with an error proportional to the scan-to-scan repeatability in tilt. Mathematically this can be represented as per Equation 1.15:

$$ZL_i = ZL_i^* + a + b^*i + Q^*i^2 \quad \text{(Equation 1.15)}$$

where:

$ZL_i$=complete lens dynamic field curvature a=unknown piston term b=unknown tilt term Q=lens quadratic term, determined to within a $$1 - \text{sigma error} \sim \frac{P}{M} \frac{\sigma_\theta}{\sqrt{N}} \quad \text{(Equation 1.16)}$$

where:

$\sigma_\theta$=scan to scan tilt repeatability standard deviation $N = N_f^* 2my + 1$=number of scan rows.

Figure 15:
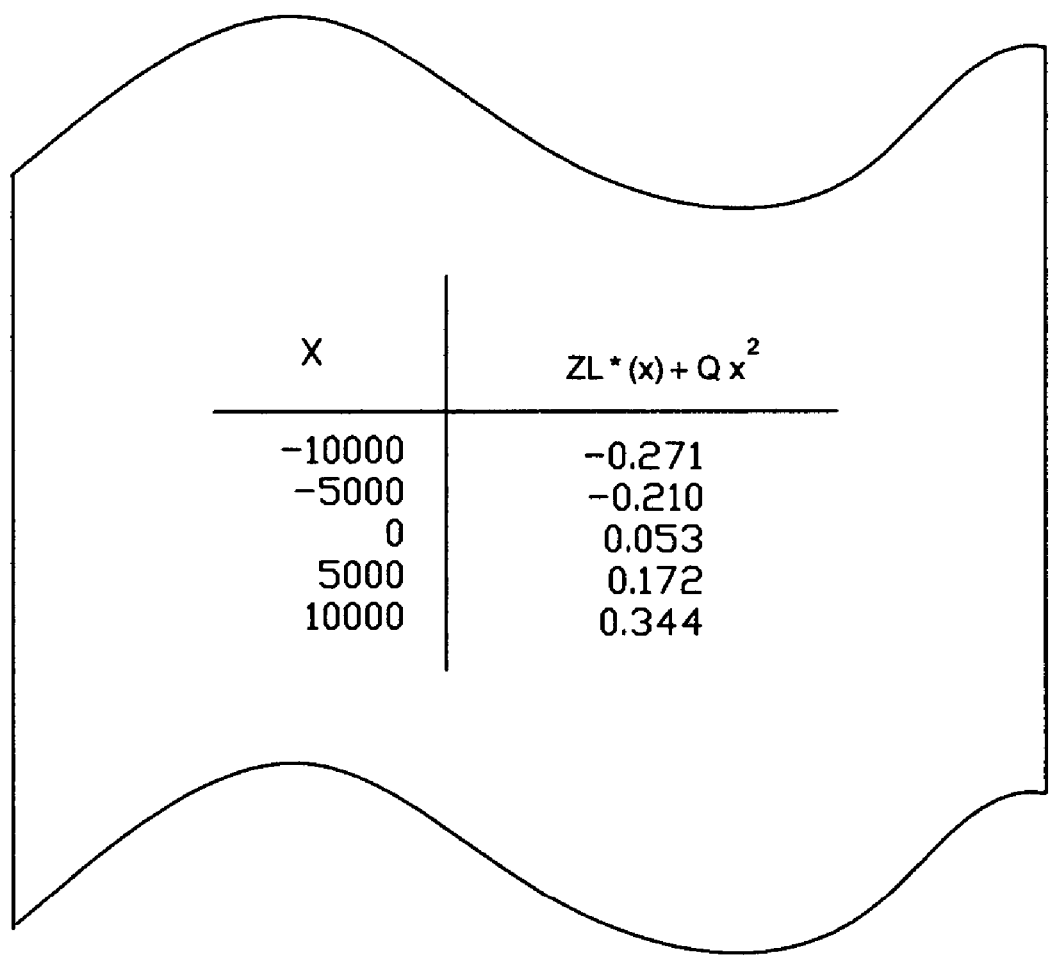
FIGS. 15 & 16 show another version of the final result of the present invention.
Figure 16:
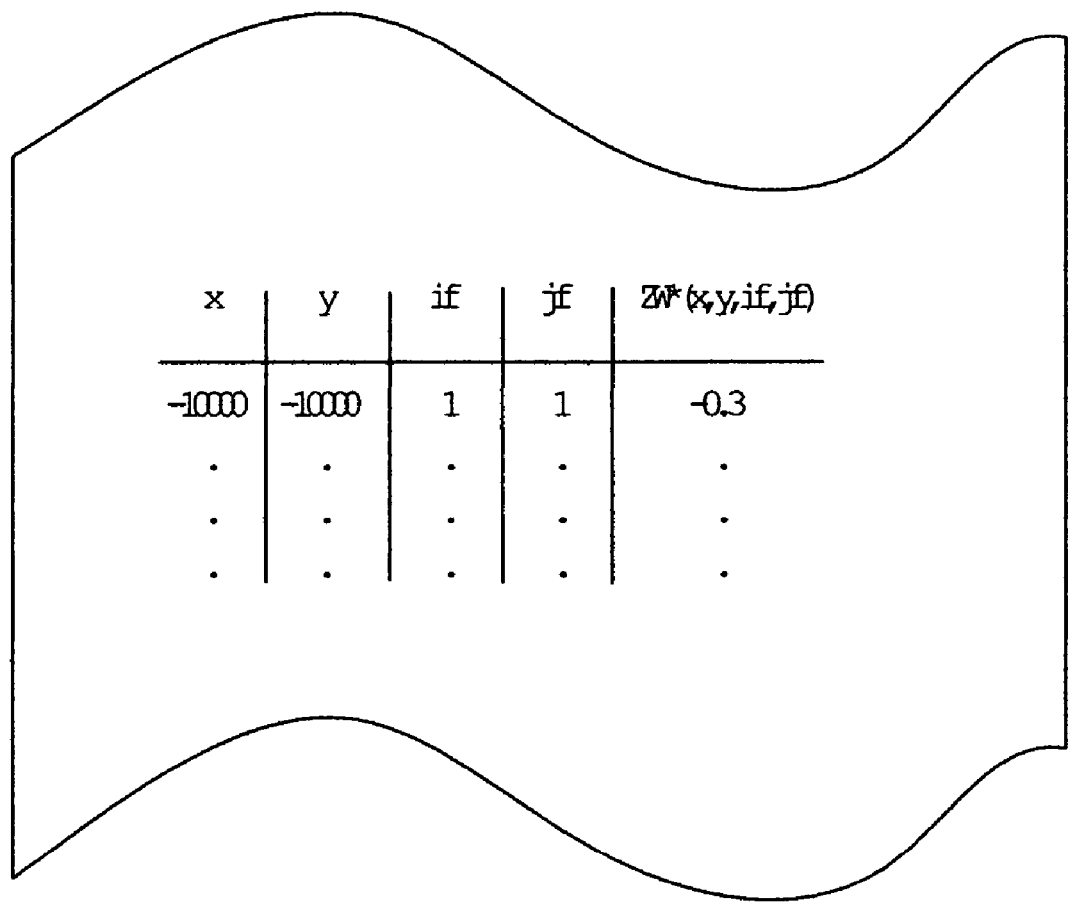

Thus, for N=100 rows, the quadratic lens distortion term Q is known to within approximately 10% of the scanner tilt repeatability. Knowing $ZL_i^* + Q^*i^2$, we can also determine the wafer flatness to within a linear term that is different for each scanned row. For example, $$ZW(i,j;if,jf) = ZW^*(i,j;if,jf) + a'(j;if,jf) + b'(j;if,jf)^*j \quad \text{(Equation 1.17)}$$

the point being that we will know the $i^2$ portion of ZW in each row. FIGS. 15 and 16 show the results of the second Main Embodiment.

Third Main Embodiment

Figure 17:
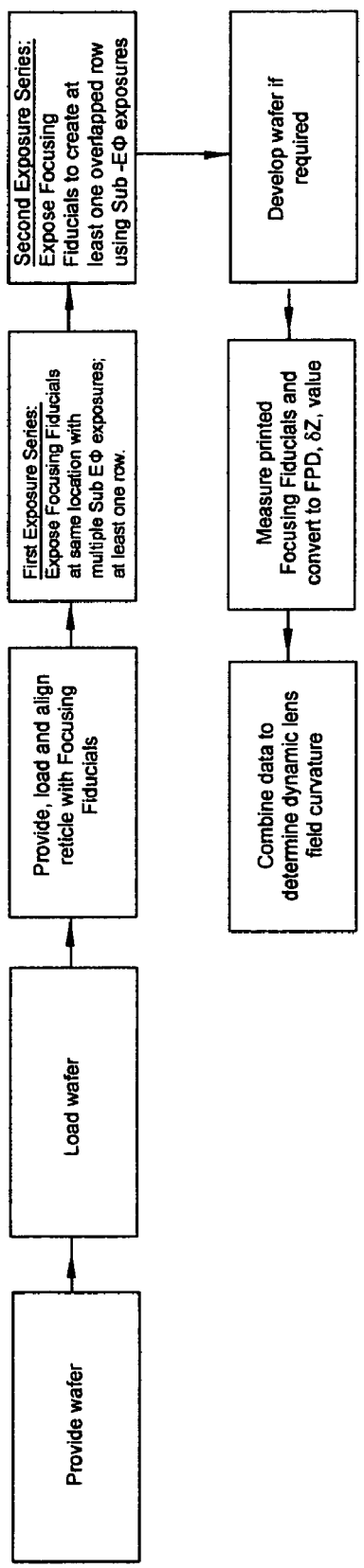
FIG. 17 shows the process flow for the third main embodiment of the present invention.

The process for the third Main Embodiment in accordance with the invention is shown in FIG. 17. This embodiment allows us to determine ZDLC to within a piston and tilt value.

Provide Wafer, Load Wafer, and Provide, Load, Align Reticle

The first three operations for the third Main Embodiment as shown in FIG. 17 (listed as "provide wafer", "load wafer", and "provide, load, and align reticle") are the same as the corresponding operations in the first Main Embodiment described above. The first and third Main Embodiments differ in the subsequent operations, beginning with the exposure operation.

First Exposure Series

The reticle R shown in FIG. 6 is dynamically exposed $N_e$ times at a single wafer location at a sub E0 or sub threshold dose E. The term "E0" (E-Zero) refers to the dose required to just clear a large exposed area of photoresist (positive photoresist). A lesser dose than E0 will leave resist residue or film behind after wafer development. The purpose of multiple exposures is to average out the scan tilt repeatability (θ) so that we can get the benefit of averaging without having to take multiple measurements of focusing fiducials. In effect, the actual printed focusing fiducials act as the carriers of the average scan performance.

The number, $N_e$, of exposures, and the sub threshold dose E will determine the effective amount of averaging (N in Equation 1.16) obtained. If $E_{tot}$ is the total accumulated dose over $N_e$ exposures we have:

$$E_{tot} = N_e^* E \quad \text{(Equation 1.18)}$$

and $E_{tot} \approx 2$-4 E0. Typically only those exposures where the accumulated dose is ≦E0 contribute to the averaging effect. Therefore the effective N in Equation 1.16 will be approximately equal to:

$$N \approx \frac{E0}{E_{tot}} * N_e \quad \text{(Equation 1.19)}$$

As an example, E0=3 mJ/cm$^2$; $E_{tot}$=6 mJ/cm$^2$; $N_e$=40 by Equation 1.19 give N≈20 as the effective number of exposures. The influence of scanner non-repeatability would therefore be reduced by a factor of $1/\sqrt{20} \approx 0.22$.

Thus, after the first exposure series of $N_e$ repeated dynamic exposures to the reticle R of FIG. 6, we would have produced the row of focusing fiducials A:E in FIG. 8.

As a practical matter, the number of exposures ($N_e$) will be limited mainly by the lithography tool's ability to perform sub E0 exposures.

Second Exposure Series

The wafer is next shifted as in the first Main Embodiment to produce an offset, overlapped row. This exposure sequence consists of a series of sub E0 dynamic exposures as in the first exposure series. The net result after the second exposure series with the reticle R are the focusing fiducials A':E' shown in FIG. 8.

Develop Wafer, Measure Focusing Fiducials

These operations are the same as the corresponding operations (sixth, seventh operations) described above in connection with the first Main Embodiment.

Determine Dynamic Lens Field Curvature

This operation exactly corresponds to the corresponding operation as in the first Main Embodiment up to the point just after solving for ZL via the singular value decomposition (SVD). Now and as before, there will be only two undetermined modes of ZL, the piston and tilt. Mathematically, this can be written as:

$$ZL = ZL_i^* + a + b^*i \quad \text{(Equation 1.20)}$$

$i = -mx:mx$ where $ZL_i^*$ is the SVD solution with the piston and tilt terms removed and a and b are the undetermined piston and tilt modes, respectively. As in the case of the second Main Embodiment, the quadratic part of the equation ($ZL_i^*$) will be determined with an accuracy dependent on the effective number of scans and the scan-to-scan roll repeatability per Equation 1.16.

The wafer height is also determined, including the quadratic modes, to within a piston and tilt term. The final output of this embodiment is shown in tabular form in FIG. 9.

Fourth Main Embodiment

The fourth embodiment is identical to the third Main Embodiment, except that the focusing fiducial reticle provided in the third step has a special structure. For the fourth Main Embodiment, the focusing fiducial reticle is designed to produce a reduced transmission over that of a standard reticle. This reduced transmission has the effect of allowing for more scans, thus increasing the N of Equation 1.16 and thereby reducing the influence of scan tilt repeatability on the result.

The focusing fiducial reticle R of FIG. 6 will typically, but with some important exceptions (described below), be designed to operate at doses $E_{tot} = G^*E0$ where G is in the range≈<2 to 5. To the extent that the projection lithography tool limits the ability to produce single dynamic scans that deliver small $$\left(\frac{E0}{100} - \frac{E0}{10}\right) \text{doses},$$

doses, the focusing fiducial reticle R can be modified to either reflect, attenuate, or otherwise diminish the amount of light passing through it. If T is the reduction factor, e.g., normalized intensity=1, passes through R before modification, but normalized intensity=T<1 passes through R after modification, then if $N_e^{max}$ is the maximum number of scans, we can utilize for a single exposure sequence before modification, $N_e^{max}/T$ (which is $>N_e^{max}$) will be the maximum number of scans we can utilize for an exposure for the reduced transmission reticle. The positive effect of this reduced transmission reticle is to practically increase the effective number of exposures of N in Equation 1.19. For example, if E0=3 mJ/cm² and $E_{min}$=minimum dose deliverable by machine for a single scan=0.5 mJ/cm², then our delivered dose per scan is $E=E_{min}$ and $N_e$=3/0.5=6. If the reticle transmission is T=6%, then the maximum number of exposures that can be delivered is:

$$N = \frac{E0}{TE_{min}} = \frac{3}{0.06*0.5} = 100 \qquad \text{(Equation 1.21)}$$

and in this case we will have decreased the error in the quadratic term of ZL to ≈10% of the scan to scan roll repeatability (see Equation 1.16).

Figure 18:
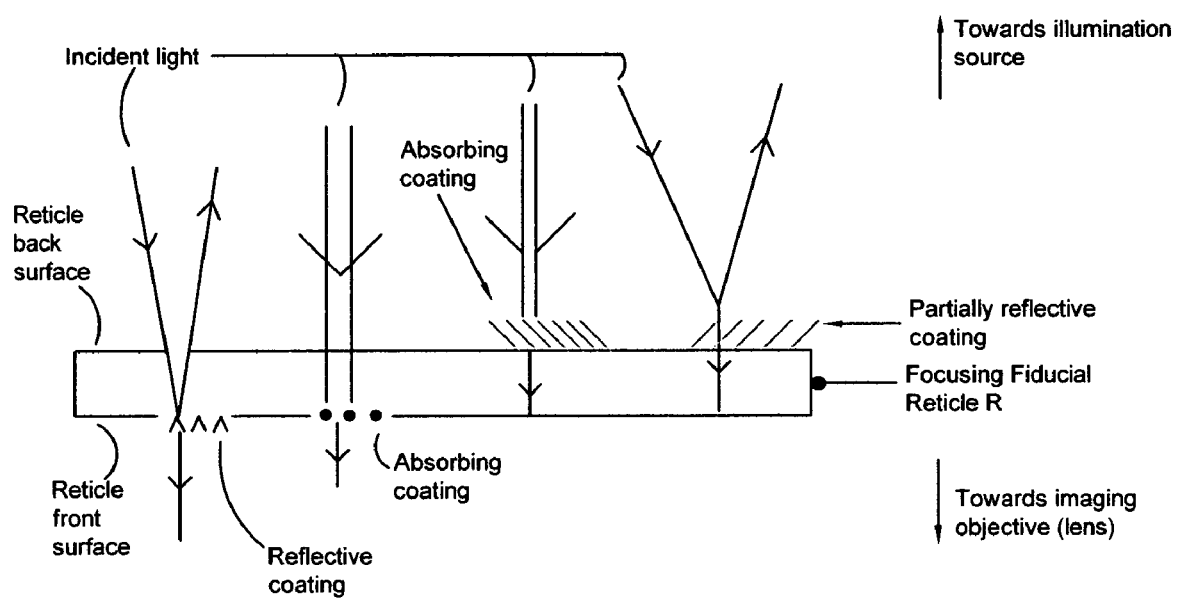
FIG. 18 shows exemplary mechanisms for making a reduced transmission Focus Fiducial reticle.

Having discussed the operation and advantages of a reduced transmission reticle, we now discuss its construction. One way, and referring to FIG. 18, is by placing a partially reflective coating on the reticle backside. This is typically a multiple layer dielectric coating and through its detailed design we can easily achieve transmission T in the 1% to 10% range and larger if necessary. This coating can be applied either before or after the standard reticle has been produced. The partially reflecting coating could also be applied to the reticle front side. Another mechanism (FIG. 18) is an absorbing coating placed on the reticle backside. This coating could consist of dielectric materials that absorb at the tool illumination wavelength or a thin metallic layer. Yet another mechanism utilizes absorbing materials placed on the mask front side. The most practical version of front side absorbing mechanisms would consist of a mask with an active area consisting of chrome and attenuated phase shift mask material. See, for example, "The Attenuated Phase Shift Mask", supra. Then the normally open areas of the mask would be replaced with attenuated phase shift regions that typically have a transmission T≈6% or 0.06.

All of the above discussion applies to FF reticles of the ISI type. This is described, for example, in U.S. Pat. No. 5,828, 455 supra and U.S. Pat. No. 5,978,085 supra, assigned to the assignee of the present invention. However, in this case because of the pinhole in the aperture plate, these reticles already operate in a reduced transmission mode with T≈1%, additional reduced transmission coatings are typically unnecessary.

The output from this embodiment is the same as the third Main Embodiment, as described above.

Variations of the Main Embodiments

Heretofore in our exposition of the two main embodiments, we have referred to single exposures or overlapped single exposures of the scanner as creating the necessary FFs on the wafer. Some technologies such as PSFM will produce FFs in a single exposure. See, for example, U.S. Pat. No. 5,300,786. Technologies such as described in "Gauging the Performance of an In-Situ Interferometer" by M. Terry et al. require two separate exposures to create a single focusing fiducial. One exposure creates the so-called "MA" pattern that is the carrier of the wafer, lens and scanner height variation information, while the other exposure creates the so-called "MO" pattern. The MO pattern creates a reference so the resulting FF can be read in an overlay metrology tool. Since the MO does not carry any significant wafer lens or scanner height variation information, this second exposure, for the purposes of this invention, can be lumped together with the first or MA exposure.

The process described above could be made more sophisticated and precise by taking into account reticle flatness effects. If we previously measure or otherwise know the reticle flatness and then provide it ($ZR_{ij}$), then referring to Equations 1.13 and 1.14, we could correct the measured FPD values and instead of Equations 1.13 and 1.14 we could obtain the equations:

$$\delta Z1(i, j; if, jf) - ZR(i, j)/M^2 = ZL_i + \qquad \text{(Eq. 1.22)}$$
$$ZW(i, j; if, jf) + ZS1(j; if, jf) + i*\frac{P}{M}\theta1(j; if, jf)$$
$i = -mx:mx$
$j = -my:my$
$if, jf = \text{all fields and}$ $$\delta Z2(i, j; if, jf) - ZR(i-1, j)/M^2 = \qquad \text{(Equation 1.23)}$$
$$ZL_{i-1} + ZW(i, j_j\ if, jf) +$$
$$ZS2(j; if, jf) + (i-1)\frac{P}{M}\theta2(j; if, jf)$$
$i = -mx+1:mx+1$
$j = -my:my$
$if, jf = \text{all fields}$ After these corrections, the operations proceed as discussed before. Also, the first, third, and fourth Main Embodiments could be similarly corrected for reticle flatness effects.

In the case of other technologies that require multiple exposures to create a single FF that can produce an FPD value, we would practice the present invention by designating the multiple exposures as a single exposure group and follow the method of this invention by using exposure groups where exposures are called for in the practice of this invention.

The present invention has been mainly described with respect to its application on the projection imaging tools (scanners) commonly used in semiconductor manufacturing today. See, for example, "Micrascan™ III Performance of a Third Generation, Catadioptric Step and Scan Lithographic Tool", D. Cote et al., *SPIE*, Vol. 3051, pp. 806-816, 1997; "ArF Step and Scan Exposure System for 0.15 Micron and 0.13 Micron Technology Node", J. Mulkens et al., *SPIE Conference on Optical Microlithography XII*, pp. 506-521, March 1999; and "0.7 NA DUV Step and Scan System for 150 nm Imaging with Improved Overlay", J. V. Schoot, *SPIE*, Vol.

3679, pp. 448-463, 1999. The methods of the present invention can be applied to other scanning projection tools, such as 2-dimensional scanners. See, for example, "Large Area Fine Line Patterning by Scanning Projection Lithography", H. Muller et al., *MCM 1994 Proceedings*, pp. 100-104, 1994; and "Large-Area, High-Throughput, High-Resolution Projection Imaging System", K. Jain, U.S. Pat. No. 5,285,236 issued Feb. 8, 1994. Other scanning projection tools to which the invention can be applied include office copy machines. See, for example, "Projection Optical System for Use in Precise Copy", T. Sato et al., U.S. Pat. No. 4,861,148 issued Aug. 29, 1989. The invention also can be applied to next generation lithography (ngl) systems such as XUV, SCALPEL, EUV (Extreme Ultra Violet), IPL (Ion Projection Lithography), EPL (electron projection lithography), and X-ray. See, for example, "Development of XUV projection lithography at 60-80 nm", B. Newnam et al., *SPIE*, Vol. 1671, pp. 419-436, 1992, (XUV); "Reduction Imaging at 14 nm Using Multilayer-Coated Optics: Printing of Features Smaller than 0.1 Micron", J. Bjorkholm et al., *Journal Vacuum Science and Technology*, B. 8(6), pp. 1509-1513, November/December 1990) (EUV); "Mix-and-Match: A Necessary Choice", R. Dejule, *Semiconductor International*, pp. 66-76, February 2000; and "Soft X-Ray Projection Lithography", N. Ceglio et al., *J. Vac. Sci. Technol.*, B 8(6), pp. 1325-1328.

The present invention has been mainly described with respect to the recording medium being positive photoresist. The present invention could equally well have been described with respect to a negative photoresist providing we make appropriate adjustment to the box-in-box structures on the reticle. In general, the recording medium is whatever is typically used on the lithographic projection tool we are measuring. Thus, on an EPL tool, an electron beam photoresist such as PMMA could be utilized as the recording medium. Thus, the recording media can be positive or negative photo resist material, electronic CCD or diode array, liquid crystal or other optically sensitive material.

So far, we have described the substrates on which the recording media is placed as wafers. This will be the case in semiconductor manufacture. The exact form of the substrate will be dictated by the projection lithography tool and its use in a specific manufacturing environment. Thus, in a flat panel manufacturing facility, the substrate on which the recording media would be placed would be a glass plate or panel. A mask making tool would utilize a reticle as a substrate. Circuit boards or multi-chip module carriers are other possible substrates.

The techniques described can be used where the reticle, or mask, is a chrome patterned glass reticle containing arrays of alignment marks. In addition the reticle can be a SCALPEL or EUV reticle containing arrays of alignment marks or a reflective mask.

The focusing fiducial can take many forms. For example, the focusing fiducials can be electronic test patterns, box-in-box, frame-in-frame, or segment-in-segment patterns. The focusing fiducials can also be segmented bar-in-bar patterns, Schnitzl patterns, FOCAL patterns, PSFM patterns, or TIS alignment marks.

While the present invention has been described in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

We claim:

1. A method of determining dynamic lens field curvature associated with a photolithographic scanner having a projection lens, the method comprising:
    exposing at least one row of an array of focusing fiducials in a reticle of the scanner onto a substrate that is coated with a recording media;
    shifting the substrate and exposing the focusing fiducials to create at least one row of printed overlapped focusing fiducials on the substrate; and
    determining dynamic lens field curvature of the projection lens in accordance with focal plane deviation (FPD) values determined from measurement of the focusing fiducials on a developed substrate.

2. A method as defined in claim 1, wherein the substrate comprises a semiconductor wafer.

3. A method as defined in claim 1, wherein the substrate comprises a flat panel display substrate.

4. A method as defined in claim 1, wherein the substrate comprises an optical plate.

5. A method as defined in claim 1, wherein the substrate comprises a recording media.

6. A method as defined in claim 1, wherein the photolithographic scanner comprises a stepper.

7. A method as defined in claim 1, wherein the photolithographic scanner comprises an electron beam imaging system or direct write machine.

8. A method as defined in claim 1, wherein the photolithographic scanner comprises an extreme ultra-violet imaging apparatus.

9. A method as defined in claim 1, wherein the photolithographic scanner comprises an electron-beam projection lithography tool.

10. A method as defined in claim 1, wherein the photolithographic scanner comprises an x-ray imaging system.

11. A method as defined in claim 1, wherein exposing the focusing fiducials comprises multiple dynamic scans that create a printed focusing fiducial array.

12. A method as defined in claim 1, wherein the focusing fiducial comprises a reduced transmission reticle.

13. A method as defined in claim 12, wherein exposing the focusing fiducials comprises multiple dynamic scans that create a printed focusing fiducial array.

14. A method as defined in claim 1, wherein exposing the focusing fiducials comprises dynamically exposing the focusing fiducial using a sub threshold exposure dose.

15. A method as defined in claim 1, wherein the substrate is shifted by an amount such that flatness of the substrate over the shifted distance does not vary beyond a desired amount.

16. A method of controlling a photolithographic projection scanner comprising:
    exposing at least one row of an array of focusing fiducials in a reticle of the scanner onto a substrate that is coated with a recording media;
    shifting the wafer substrate and exposing the focusing fiducials to create at least one row of printed overlapped focusing fiducials on the substrate;
    determining dynamic lens field curvature of the projection lens in accordance with focal plane deviation (FPD) values determined from measurement of the focusing fiducials on a developed substrate; and
    adjusting the scanner in accordance with the determined dynamic lens field curvature of the projection lens so as to minimize the effects of the dynamic lens field curvature of the scanner.

17. A method as defined in claim 16, whereby the substrate comprises a semiconductor wafer.

* * * * *